(12) United States Patent
Komiya et al.

(10) Patent No.: US 11,024,646 B2
(45) Date of Patent: Jun. 1, 2021

(54) MEMORY DEVICE

(71) Applicant: TOSHIBA MEMORY CORPORATION, Minato-ku (JP)

(72) Inventors: Reiko Komiya, Nagoya (JP); Tatsuo Izumi, Yokkaichi (JP); Takaya Yamanaka, Yokkaichi (JP); Takeshi Nagatomo, Yokkaichi (JP); Karin Takagi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/695,749

(22) Filed: Nov. 26, 2019

(65) Prior Publication Data

US 2020/0098790 A1   Mar. 26, 2020

Related U.S. Application Data

(63) Continuation of application No. 16/127,634, filed on Sep. 11, 2018, now Pat. No. 10,529,735.

(30) Foreign Application Priority Data

Mar. 13, 2018   (JP) .............................. JP2018-045703

(51) Int. Cl.
| | | |
|---|---|---|
| *H01L 27/1158* | (2017.01) | |
| *H01L 27/11582* | (2017.01) | |
| *H01L 27/1157* | (2017.01) | |
| *G11C 8/14* | (2006.01) | |
| *G11C 7/18* | (2006.01) | |

(Continued)

(52) U.S. Cl.
CPC .......... *H01L 27/11582* (2013.01); *G11C 7/18* (2013.01); *G11C 8/14* (2013.01); *H01L 27/1157* (2013.01); *H01L 27/11524* (2013.01); *H01L 27/11556* (2013.01)

(58) Field of Classification Search
CPC ........... H01L 27/11582; H01L 27/1157; H01L 21/02381; H01L 21/02532; H01L 21/28273; H01L 21/28282; H01L 27/11524
See application file for complete search history.

(56) References Cited

U.S. PATENT DOCUMENTS

| | | | | |
|---|---|---|---|---|
| 9,343,475 | B2 * | 5/2016 | Jang | .................... H01L 27/1157 |
| 9,786,676 | B2 * | 10/2017 | Yun | .................... H01L 27/11565 |
| 9,997,536 | B2 * | 6/2018 | Noda | .................... H01L 27/1157 |

(Continued)

*Primary Examiner* — Dung A. Le
(74) *Attorney, Agent, or Firm* — Oblon, McClelland, Maier & Neustadt, L.L.P.

(57) ABSTRACT

A memory device includes a conductive layer, a plurality of first electrode layers, a first semiconductor layer extending through the plurality of first electrode layers in a first direction toward the plurality of first electrode layers from the conductive layer, a first insulating film including a tunneling insulator film, a charge-trapping film and a blocking insulator film, a second electrode layer, and a semiconductor base. The charge-trapping film is spaced along the first direction from the semiconductor base, a distance in the first direction between the charge-trapping film and the semiconductor base is larger than a thickness of the blocking insulator film in a second direction toward the plurality of first electrode layers from the first semiconductor layer.

19 Claims, 32 Drawing Sheets

(51) Int. Cl.
*H01L 27/11556* (2017.01)
*H01L 27/11524* (2017.01)

(56) References Cited

U.S. PATENT DOCUMENTS 10,276,590 B2 * 4/2019 Hamada ................ H01L 29/792
2011/0073866 A1 3/2011 Kim et al.

* cited by examiner

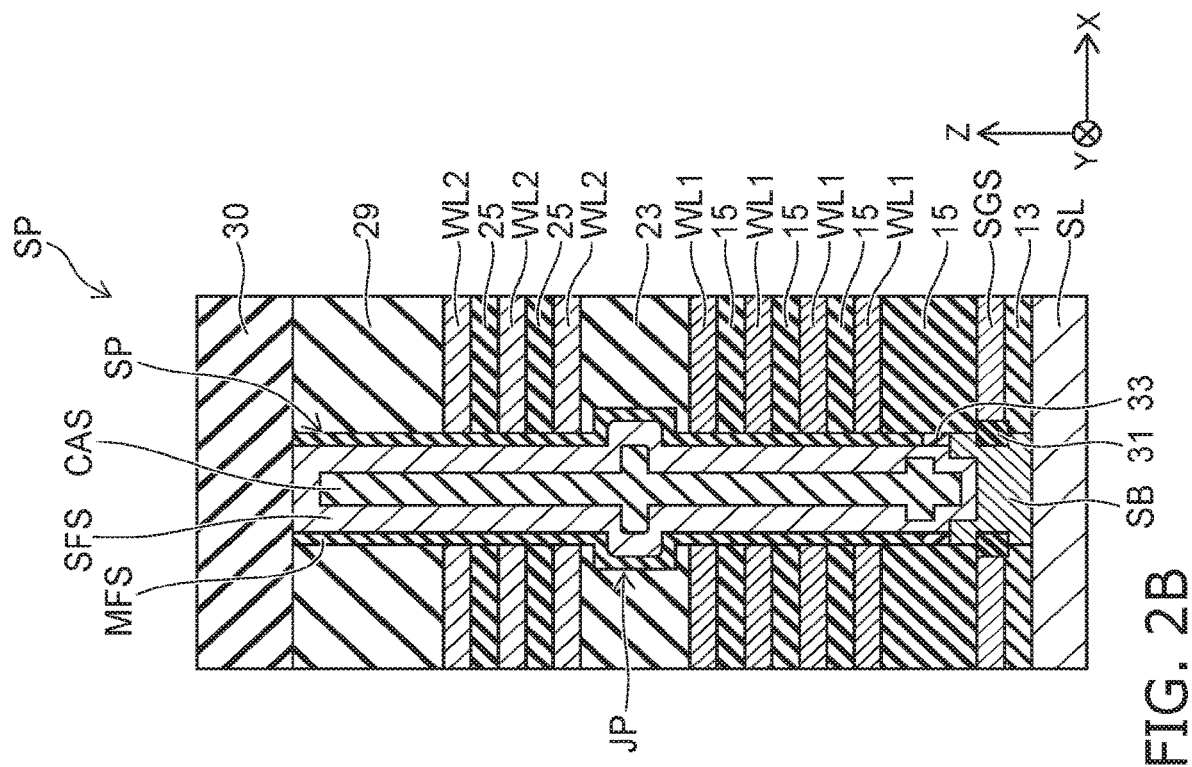
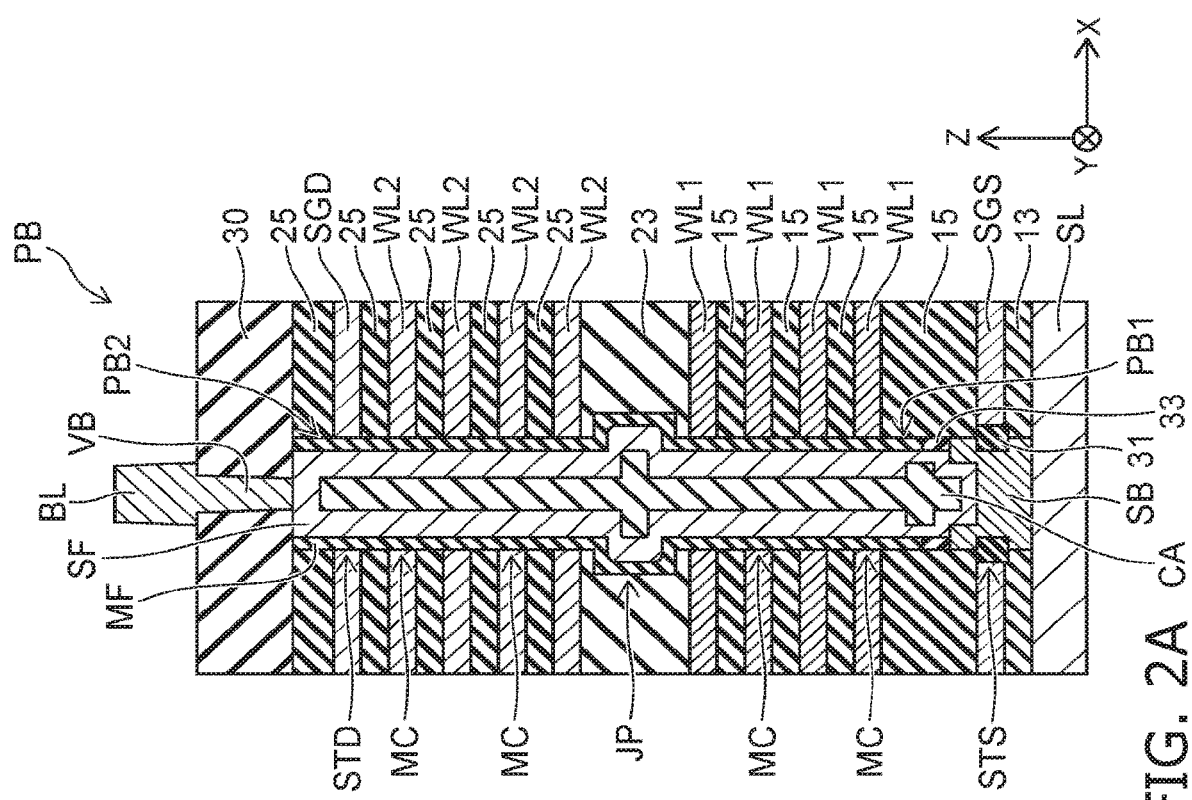

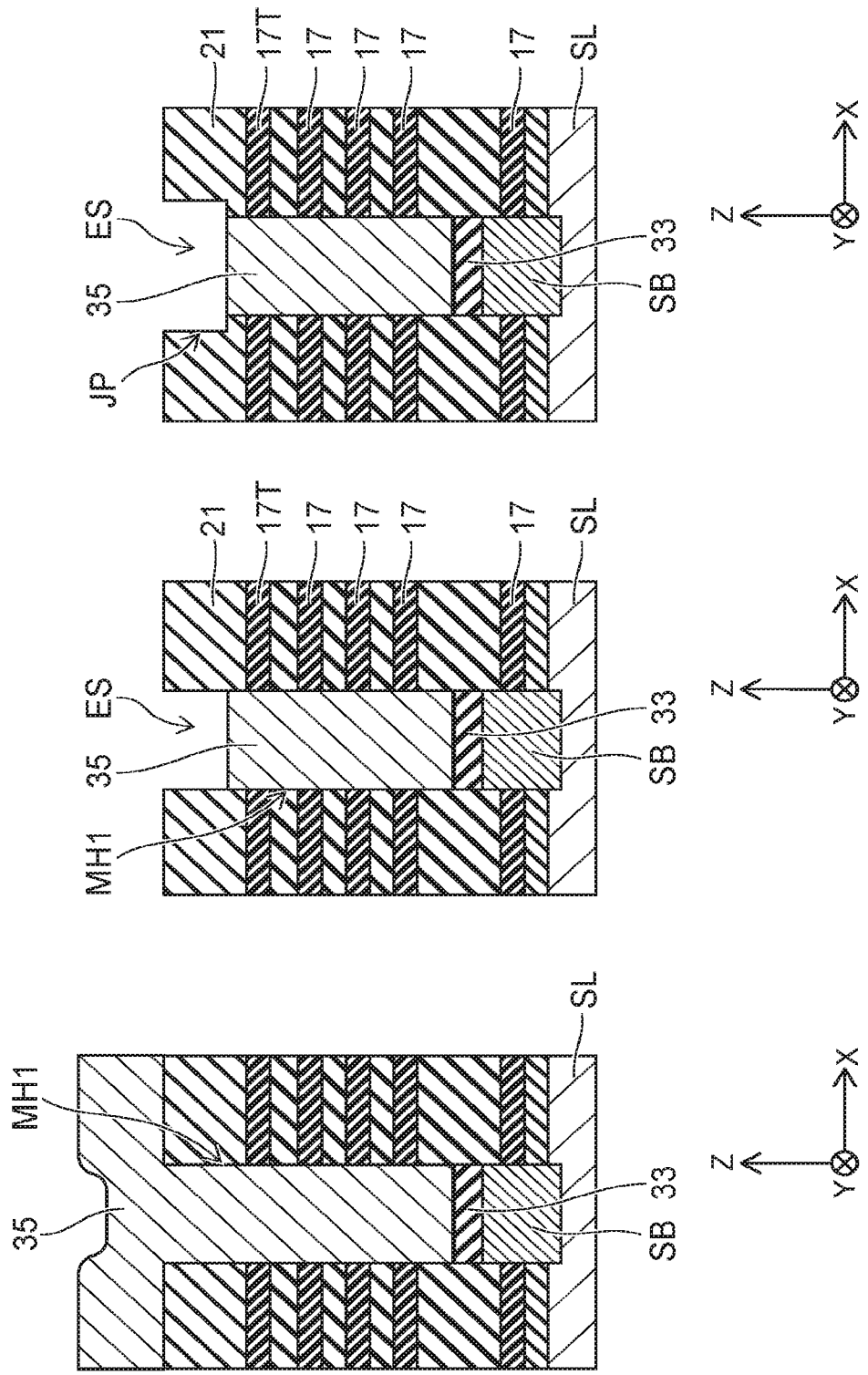

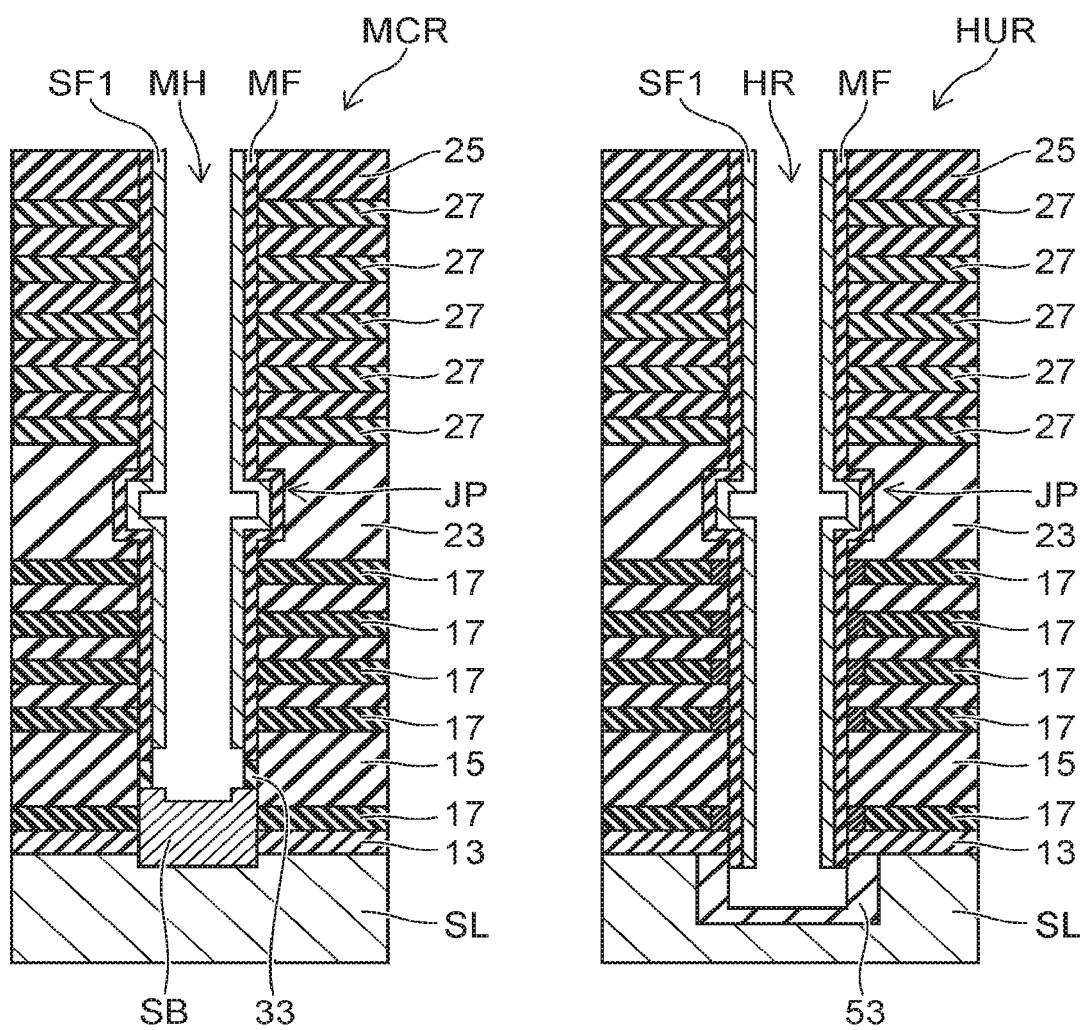
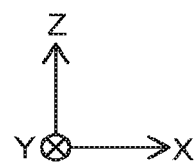
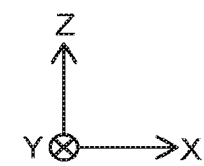

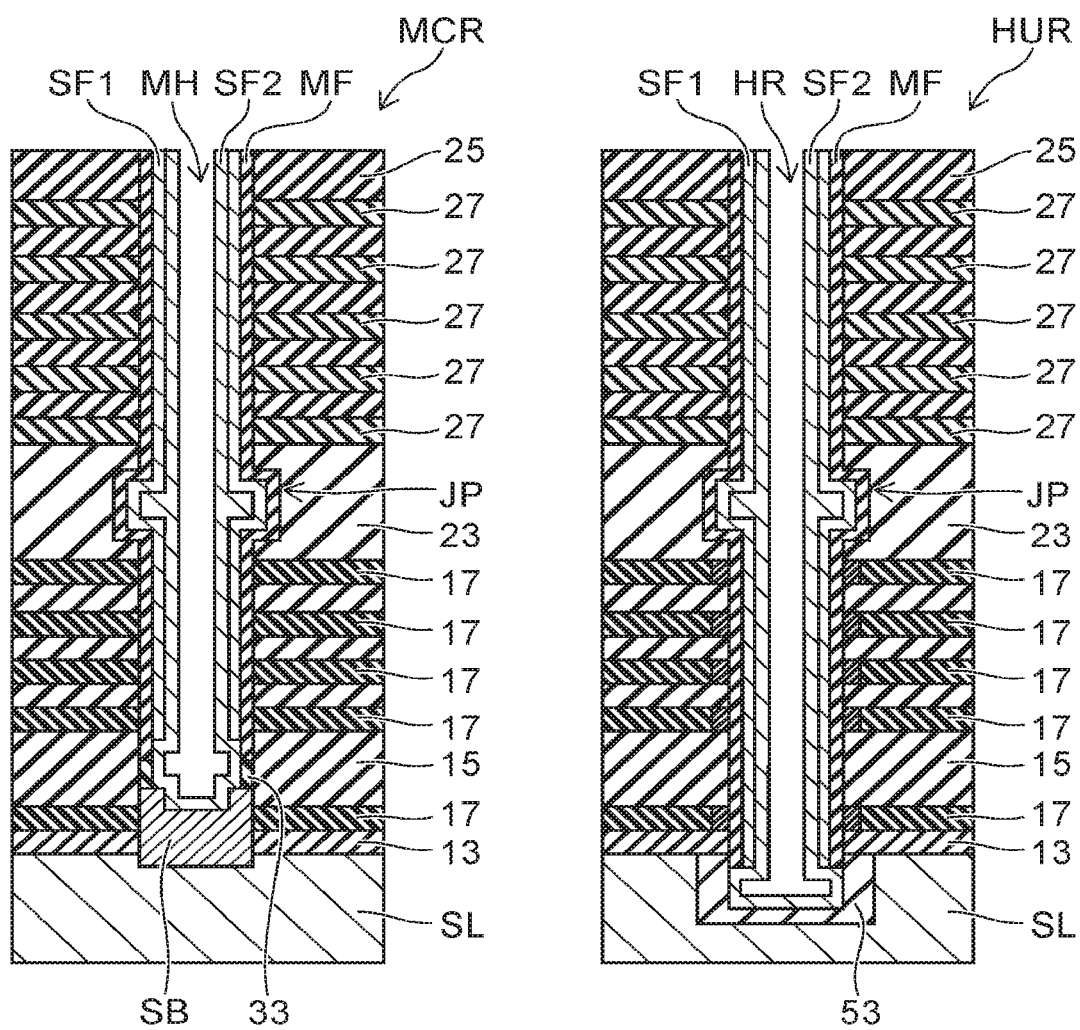
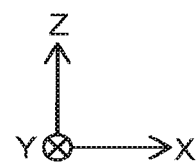
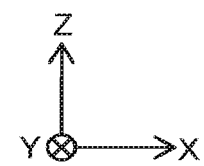
FIG. 25A        FIG. 25B

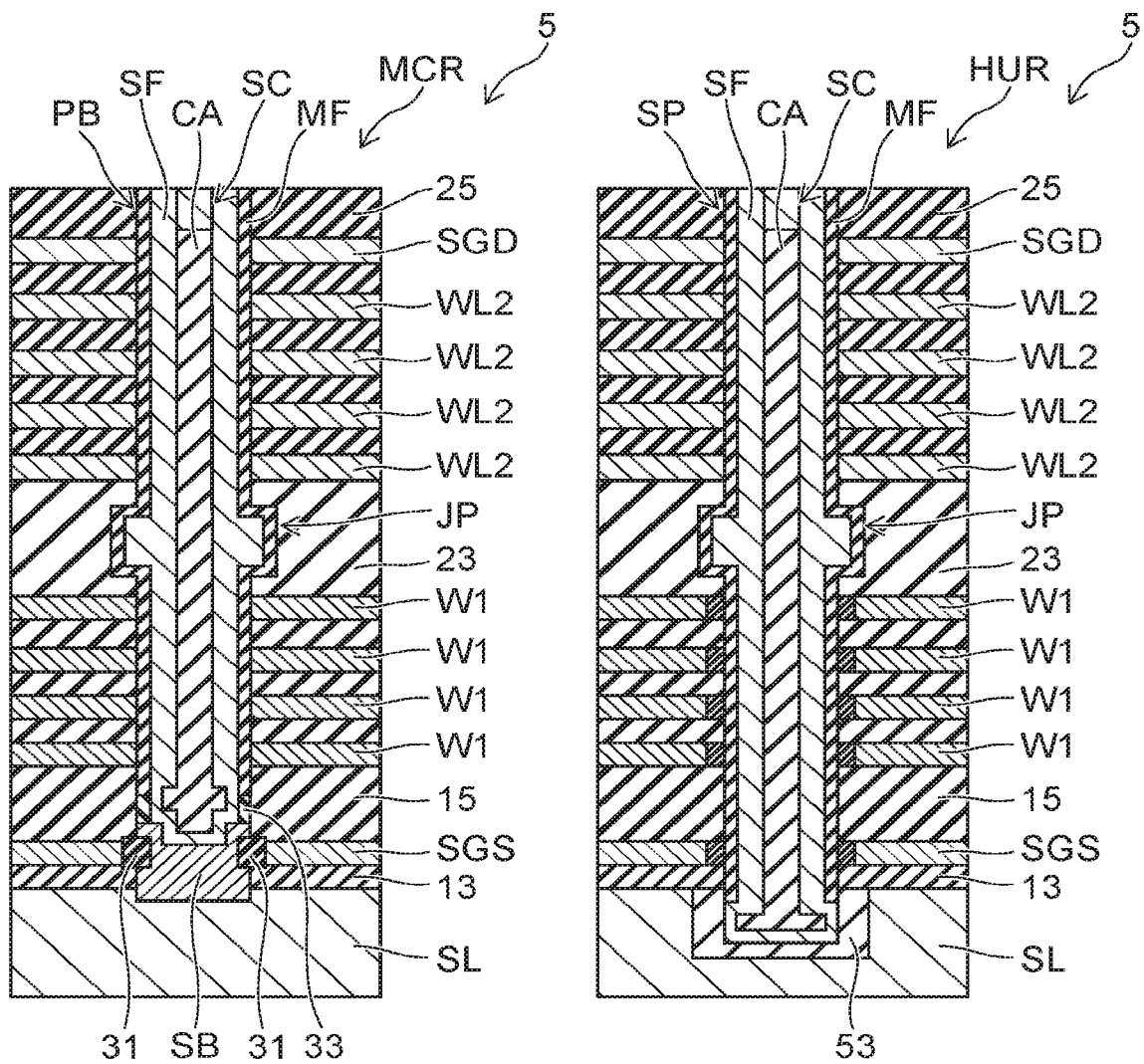
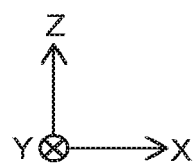
FIG. 26A
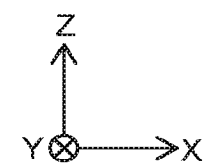
FIG. 26B

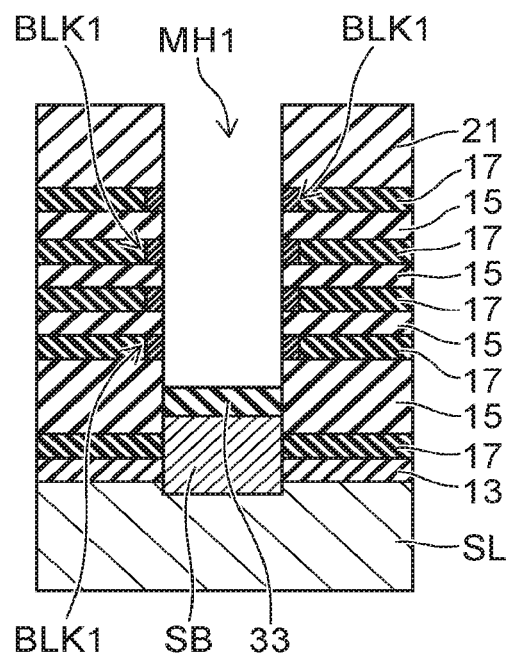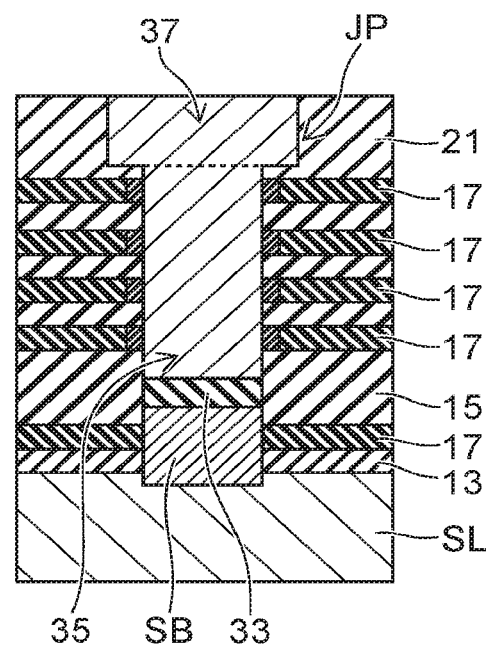
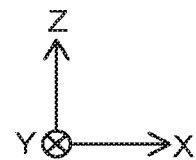 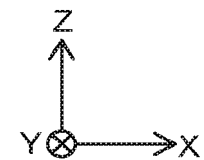
FIG. 28A  FIG. 28B

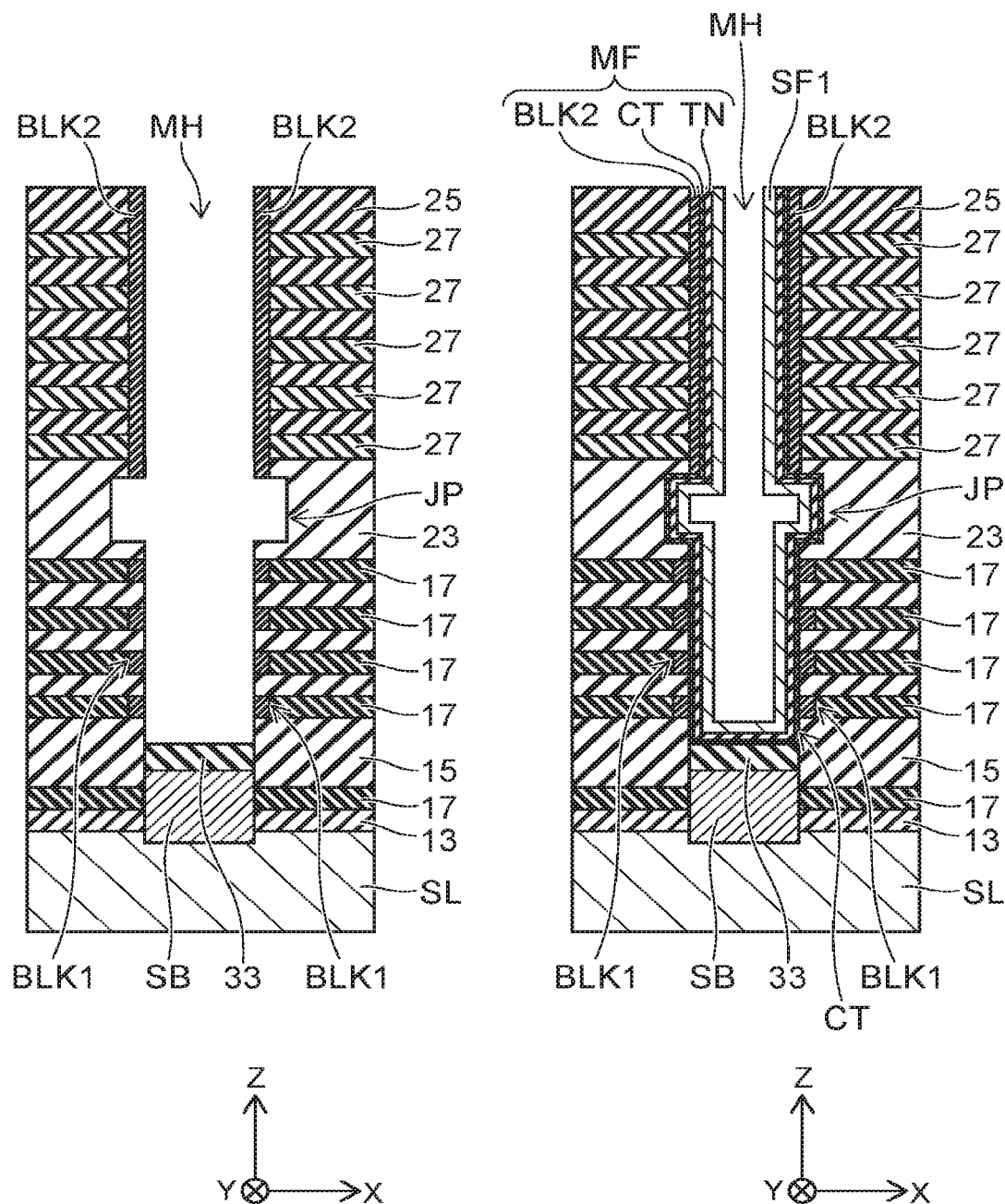

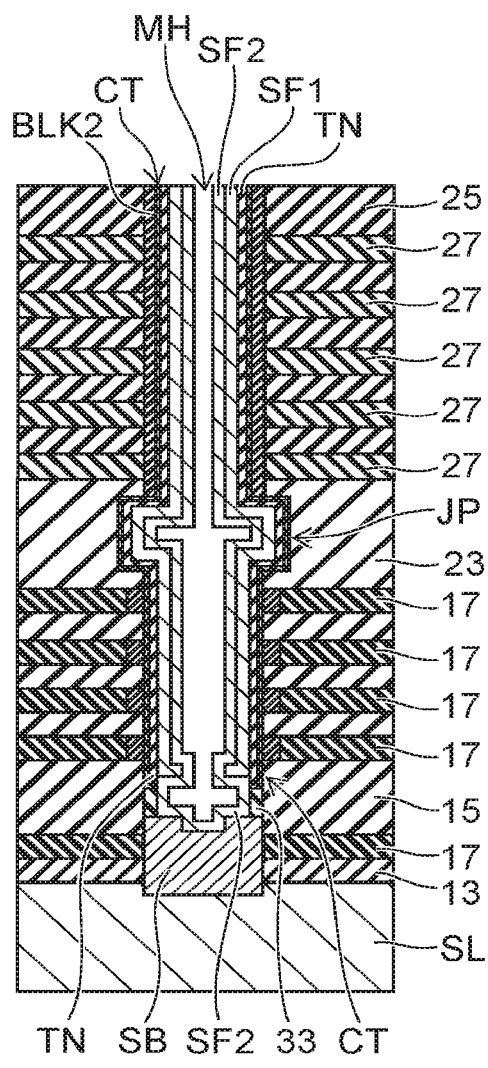
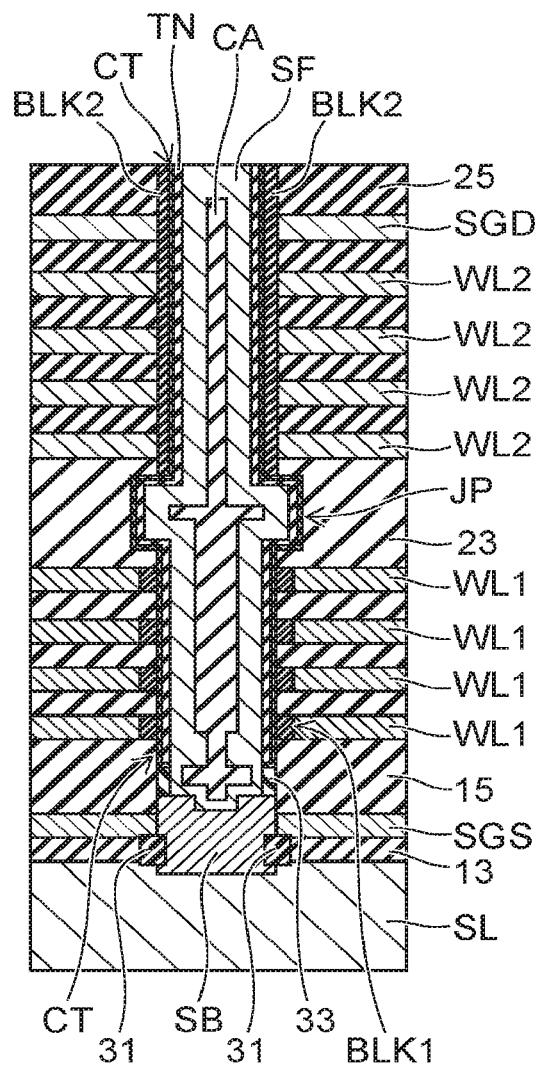
FIG. 32A
FIG. 32B

MEMORY DEVICE

CROSS-REFERENCE TO RELATED APPLICATIONS

This application is a continuation of U.S. application Ser. No. 16/127,634, filed Sep. 11, 2018 (now U.S. Pat. No. 10,529,735), which is based upon and claims the benefit of priority from Japanese Patent Application No. 2018-045703, filed on Mar. 13, 2018; the entire contents of each of which are incorporated herein by reference.

FIELD

Embodiments relate to a memory device.

BACKGROUND

A memory device that includes three-dimensionally arranged memory cells is being developed. For example, a NAND nonvolatile memory device includes multiple electrode layers and a semiconductor layer having a columnar configuration piercing the multiple electrode layers; and memory cells are provided between the semiconductor layer and the electrode layers. In a memory device having such a structure, the memory capacity can be increased by increasing the number of electrode layers. However, when the electrode layers are increased, the cell current that flows through the semiconductor layer piercing the electrode layers may decrease.

BRIEF DESCRIPTION OF THE DRAWINGS

FIGS. 2A and 2B are schematic cross-sectional views showing the memory device according to the first embodiment;

FIGS. 4A to 14B are schematic cross-sectional views showing manufacturing processes of the memory device according to the first embodiment;

FIG. 18A to FIG. 26B are schematic cross-sectional views showing manufacturing processes of a memory device according to a second embodiment;

FIG. 28A to FIG. 32B are schematic cross-sectional views showing manufacturing processes of the memory device according to the third embodiment.

DETAILED DESCRIPTION

Figure 1:
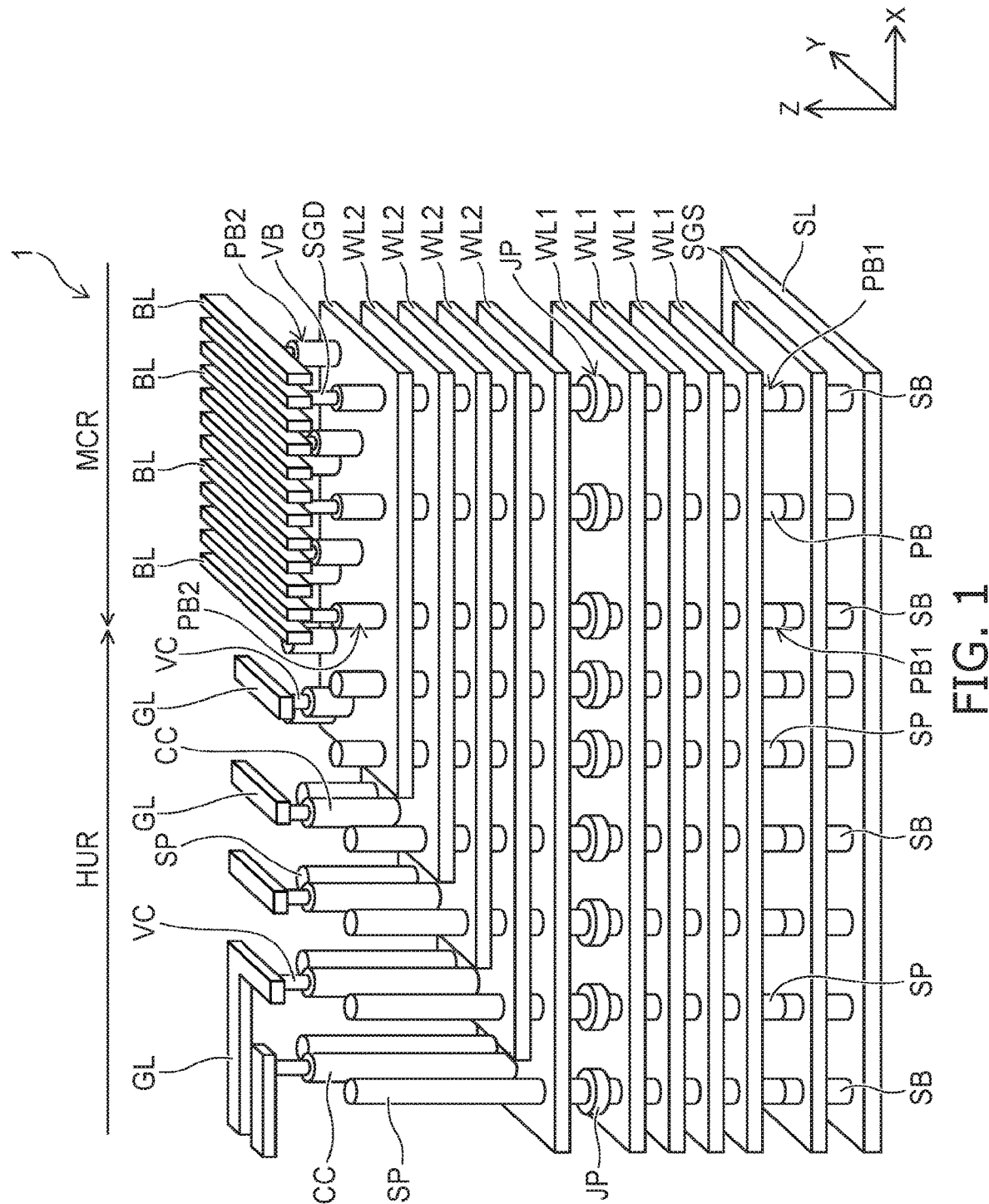
FIG. 1 is a perspective view schematically showing a memory device 1 according to a first embodiment.

According to one embodiment, a memory device includes a conductive layer, a plurality of first electrode layers, a first semiconductor layer, a first insulating film, a second electrode layer and a semiconductor base. The plurality of first electrode layers are stacked above the conductive layer. The first semiconductor layer pierces the plurality of first electrode layers in a first direction, wherein the first direction is from the conductive layer toward the plurality of first electrode layers. The first insulating film is provided to surround the first semiconductor layer between the first semiconductor layer and the plurality of first electrode layers. The first insulating film includes a first film, a second film, and a third film provided in order in a second direction, wherein the second direction is from the first semiconductor layer toward one of the plurality of first electrode layers. The second electrode layer is provided between the conductive layer and the first electrode layer of the plurality of first electrode layers most proximal to the conductive layer. The semiconductor base is connected to the first semiconductor layer, and is provided to pierce the second electrode layer in the first direction between the conductive layer and the first semiconductor layer. A spacing in the first direction between the second film and a surface of the semiconductor base contacting the first semiconductor layer is wider than a film thickness of the third film in the second direction. A minimum width in the second direction of an outer perimeter of a portion of the first semiconductor layer surrounded with the first insulating film is substantially the same as a first width in the second direction of an outer perimeter of a portion of the first semiconductor layer piercing the most proximal first electrode layer. A second width in the second direction of an outer perimeter of the first semiconductor layer positioned at a level between the semiconductor base and the first insulating film is substantially the same as or wider than the first width, and is narrower than a third width in the second direction, wherein the third width is of an outer perimeter of the first insulating film covering the portion of the first semiconductor layer piercing the most proximal first electrode layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a perspective view schematically showing a memory device 1 according to a first embodiment. The memory device 1 is, for example, a NAND flash memory device and includes three-dimensionally arranged memory cells. Insulating films that electrically insulate between adjacent components are not illustrated in FIG. 1.

As shown in FIG. 1, the memory device 1 includes a conductive layer (hereinbelow, a source layer SL), a select gate SGS, word lines WL1, word lines WL2, and a select gate SGD. The select gate SGS, the word lines WL1 and WL2, and the select gate SGD are stacked on the source layer SL. The source layer SL, the select gate SGS, the word lines WL1 and WL2, and the select gate SGD are electrically insulated from each other by not-illustrated inter-layer insulating films. The number of stacks of the word lines WL1 and WL2 is not limited to the example shown in FIG. 1.

The memory device 1 includes a memory cell region MCR and a draw-out region HUR. Multiple columnar bodies PB are provided in the memory cell region MCR. The columnar bodies PB each include columnar portions PB1 and PB2 and a connection portion JP. A semiconductor base SB is further provided between the source layer SL and the columnar body PB.

The columnar portion PB1 extends in a Z-direction and pierces the word lines WL1. The columnar portion PB2 extends in the Z-direction and pierces the word lines WL2 and the select gate SGD. The connection portion JP connects the columnar portion PB1 and the columnar portion PB2. The columnar portion PB1 is connected to the semiconductor base SB.

The semiconductor base SB extends in the Z-direction and pierces the select gate SGS. The columnar body PB is connected to the source layer SL via the semiconductor base SB. The columnar body PB also is connected to a bit line BL via a connection plug VB.

The draw-out region HUR includes end portions of the select gate SGS, the word lines WL1 and WL2, and the select gate SGD. As shown in FIG. 1, the end portions of the word lines WL2 and the select gate SGD are provided in a staircase configuration; and the end portions are connected respectively to contact plugs CC. The contact plugs CC electrically connect between the word lines WL2 and gate interconnects GL and between the select gate SGD and the gate interconnect GL via connection plugs VC. The end portions of the select gate SGS and the word lines WL1 also are provided in a staircase configuration at a not-illustrated portion and are electrically connected to the gate interconnects GL via the contact plugs CC and the connection plugs VC.

The draw-out region HUR further includes a columnar support body SP. The columnar support body SP is provided at the vicinity of the contact plugs CC, extends in the Z-direction, and pierces at least one of the word line WL1 or WL2 or the select gate SGD. The columnar support body SP includes a lower portion piercing the word lines WL1, an upper portion piercing the word lines WL2 and the select gate SGD, and the connection portion JP linking between the lower portion and the upper portion.

FIGS. 2A and 2B are schematic cross-sectional views showing the memory device 1 according to the first embodiment. FIG. 2A is a schematic cross-sectional view of the columnar body PB; and FIG. 2B is a schematic cross-sectional view of the columnar support body SP.

As shown in FIG. 2A, the memory device 1 includes inter-layer insulating films 13, 15, 23, 25, and 30. The inter-layer insulating film 13 is provided between the source layer SL and the select gate SGS. The inter-layer insulating films 15 are provided between the word lines WL1 adjacent to each other in the Z-direction and between the select gate SGS and the word line WL1. The inter-layer insulating film 23 is provided between the word line WL1 and the word line WL2; and the connection portion JP is positioned inside the inter-layer insulating film 23.

The inter-layer insulating films 25 are provided between the word lines WL2 adjacent to each other in the Z-direction. The inter-layer insulating film 25 is further provided between the word line WL2 and the inter-layer insulating film 30. The inter-layer insulating film 30 covers the upper end of the columnar body PB.

The columnar body PB includes a memory film MF, a semiconductor layer SF, and an insulating core CA. The insulating core CA extends in the Z-direction in the interior of the columnar body PB. The semiconductor layer SF surrounds the insulating core CA and extends in the Z-direction. The memory film MF is positioned between the semiconductor layer SF and the word lines WL and extends in the Z-direction along the semiconductor layer SF. The memory film MF is positioned between the semiconductor layer SF and the select gate SGD. Hereinbelow, the word line WL1 and the word line WL2 are generally called the word line WL in the description.

The semiconductor layer SF is connected to the semiconductor base SB at the lower end of the semiconductor layer SF. The semiconductor base SB is connected to the source layer SL at the lower end of the semiconductor base SB and electrically connects the semiconductor layer SF and the source layer SL. An insulating film 31 is provided between the semiconductor base SB and the select gate SGS. An insulating film 33 is provided between the semiconductor base SB and the memory film MF.

The semiconductor layer SF is connected to the connection plug VB at the upper end of the semiconductor layer SF. The connection plug VB is provided inside the inter-layer insulating film 30 and electrically connects the semiconductor layer SF to the bit line BL provided on the inter-layer insulating film 30.

The memory device 1 includes a select transistor STS, memory cells MC, and a select transistor STD. The select transistor STD is provided at a portion where the semiconductor layer SF crosses the select gate SGD. The memory cells MC are provided at portions where the semiconductor layer SF crosses the word lines WL. The select transistor STD includes a portion of the memory film MF as a gate insulating film. The memory cells MC include portions of the memory film MF as charge retaining portions.

The select transistor STS is provided at a portion where the semiconductor base SB pierces the select gate SGS. The insulating film 31 that is provided between the semiconductor base SB and the select gate SGS functions as a gate insulating film of the select transistor STS.

As shown in FIG. 2B, the columnar support body SP includes a memory film MFS, a semiconductor layer SFS, and an insulating core CAS. The columnar support body SP is formed using the same processes as the columnar body PB and has a similar structure. The material of the memory film MFS is the same as the material of the memory film MF of the columnar body PB. The material of the semiconductor layer SFS is the same as the material of the semiconductor layer SF of the columnar body PB. The material of the insulating core CAS is the same as the material of the insulating core CA of the columnar body PB.

The columnar support body SP is formed to pierce the end portions of the word lines WL and the select gate SGD formed in the staircase configuration in the draw-out region HUR. Therefore, the number of the word lines WL and the select gates SGD crossing the columnar support body SP is different according to the position where the columnar support body SP is provided. In other words, the columnar support body SP is provided to pierce at least one word line WL counting from the word line WL of the lowermost layer.

The upper portion of the columnar support body SP is provided to pierce an insulating film 29 burying the end portions of the word lines WL formed in the staircase configuration. The upper end of the columnar support body SP is covered with the inter-layer insulating film 30 provided on the insulating film 29 and is electrically insulated from the interconnects of the upper layers (not illustrated).

Figure 3:
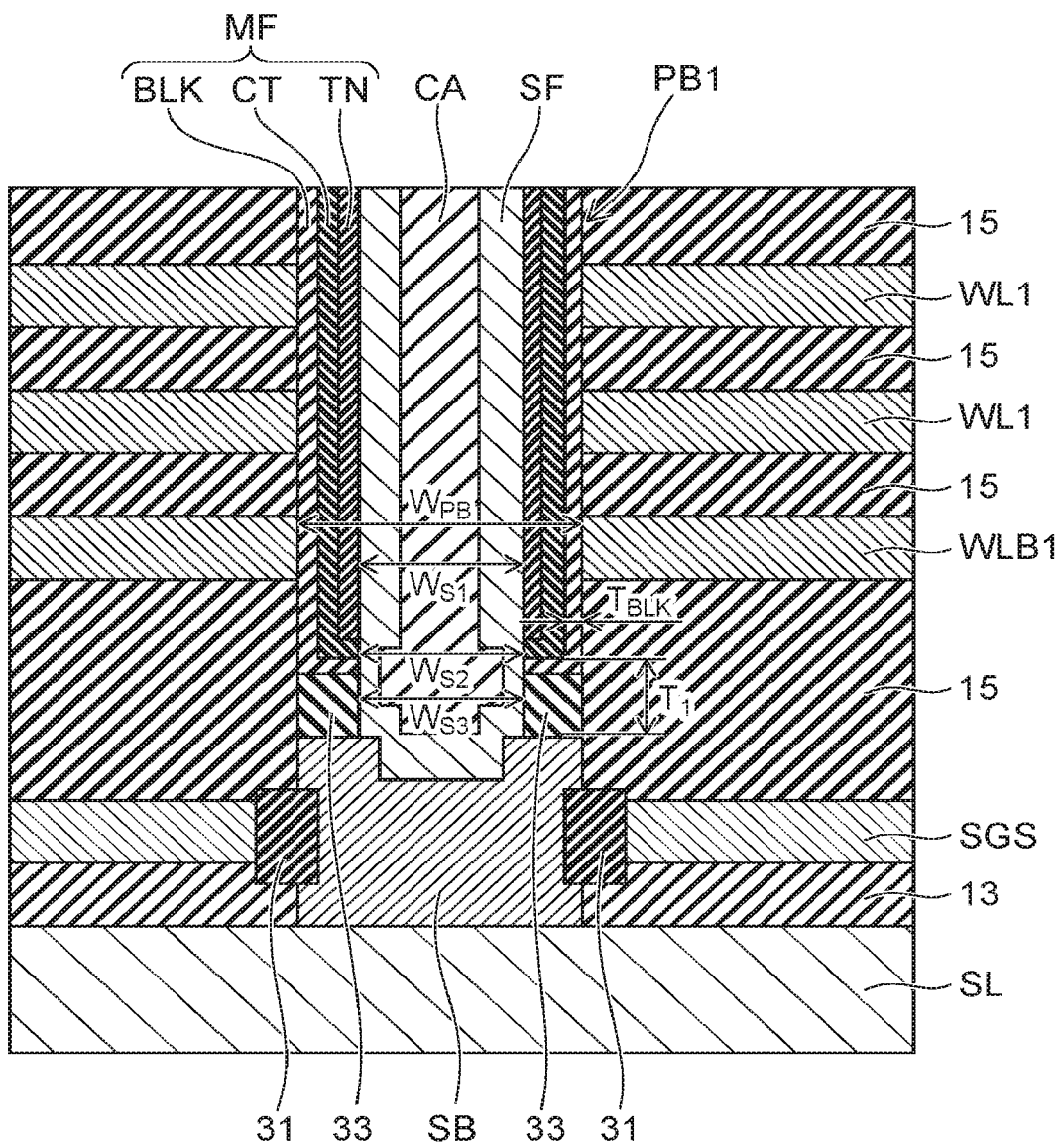
FIG. 3 is a partial cross-sectional view schematically showing the memory device according to the first embodiment.

FIG. 3 is a partial cross-sectional view schematically showing the memory device 1 according to the first embodiment. FIG. 3 is a schematic cross-sectional view showing the structure of the lower portion of the columnar body PB.

As shown in FIG. 3, the memory film MF includes a tunneling insulating film TN, a charge trap film CT, and a blocking insulating film BLK. The charge trap film CT is provided between the tunneling insulating film TN and the blocking insulating film BLK. The tunneling insulating film TN contacts the semiconductor layer SF; and the blocking insulating film BLK contacts the word lines WL1 and the inter-layer insulating films 15.

The tunneling insulating film TN is, for example, a silicon oxide film; and the charge trap film CT is, for example, a silicon nitride film. The blocking insulating film BLK is, for example, a silicon oxide film. The blocking insulating film BLK also may include an insulative metal oxide, e.g., aluminum oxide, etc.

The embodiment is not limited to the example; and, for example, memory cells MC having floating gate structures may be used. For example, instead of the charge trap film CT, the memory film MF may include conductive films at the portions positioned between the semiconductor layer SF and the word lines WL. The conductive films are positioned between the tunneling insulating film TN and the blocking insulating film BLK and are arranged to be separated from each other in the Z-direction.

The semiconductor layer SF has a width $W_{S1}$ in an X-direction of the outer perimeter at a position crossing a word line WLB1 of the lowermost layer, a width $W_{S2}$ in the X-direction of the outer perimeter at the lower end position of the memory film MF, and a width $W_{S3}$ in the X-direction of the outer perimeter surrounded with the insulating film 33. In the case where the horizontal cross section of the semiconductor layer SF is substantially a circle, $W_{S1}$, $W_{S2}$, and $W_{S3}$ are the outer diameters of the semiconductor layer SF at the respective positions.

Here, $W_{S2}$ is the minimum width in the X-direction of the semiconductor layer SF and is substantially the same as $W_{S1}$ in the embodiment. $W_{S3}$ is substantially the same as $W_{S2}$ or wider than $W_{S2}$.

Because the insulating film 33 is provided on the semiconductor base SB, a spacing $T_1$ between the lower end of the charge trap film CT and the surface where the semiconductor layer SF and the semiconductor base SB contact, i.e., the upper surface of the semiconductor base SB, is wider than a film thickness $T_{BLK}$ of the blocking insulating film BLK. The memory film MF has a width $W_{PB}$ in the X-direction of the outer perimeter at a position contacting the word line WLB1; and $W_{S3}$ is narrower than $W_{PB}$.

A method for manufacturing the memory device 1 according to the first embodiment will now be described with reference to FIG. 4A to FIG. 14B. FIG. 4A to FIG. 14B are schematic cross-sectional views showing manufacturing processes of the memory device 1. Although FIG. 4A to FIG. 14B show the manufacturing processes of the semiconductor base SB and the columnar body PB, it should be noted that the columnar support body SP also is formed simultaneously in the embodiment.

Figure 4C:
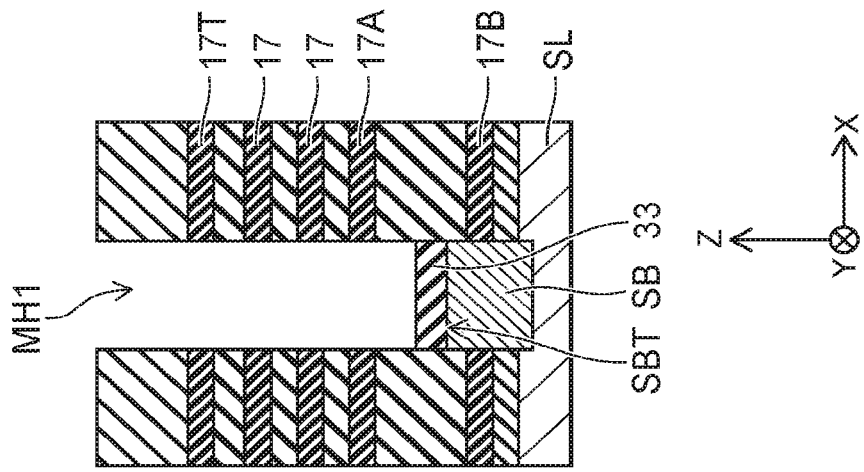
Figure 4B:
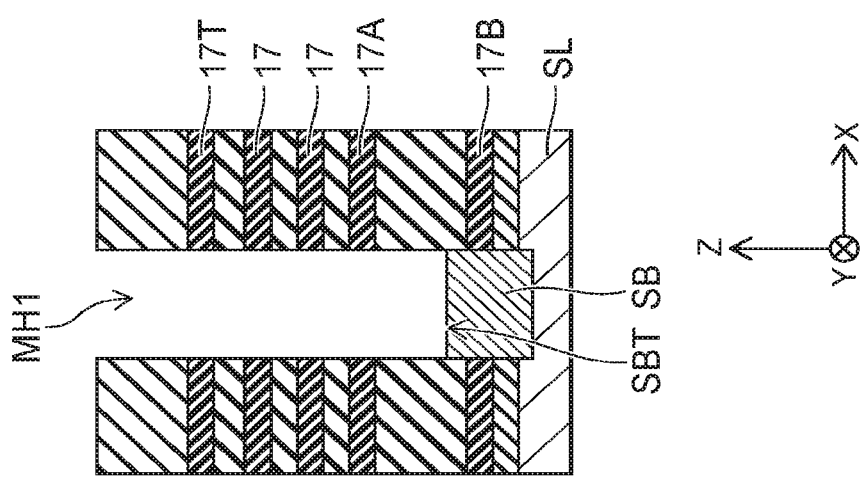
Figure 4A:
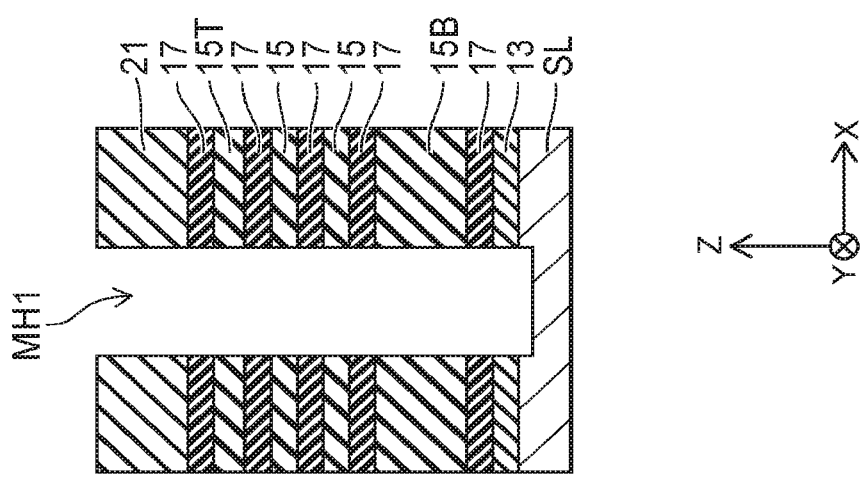

As shown in FIG. 4A, a memory hole MH1 is formed after stacking the inter-layer insulating films 13, 15, and 21 and sacrificial films 17 on the source layer SL. Also, the end portions of the sacrificial films 17 are formed in a staircase configuration at a portion used to form the draw-out region HUR (not illustrated).

The sacrificial films 17 are provided between the inter-layer insulating film 13 and an inter-layer insulating film 15B, between the inter-layer insulating films 15 adjacent to each other in the Z-direction, and between an inter-layer insulating film 15T and the inter-layer insulating film 21. Here, the inter-layer insulating film 15B is the lowermost inter-layer insulating film 15 of the multiple inter-layer insulating films 15. The inter-layer insulating film 15T is the uppermost inter-layer insulating film 15 of the multiple inter-layer insulating films 15.

The memory hole MH1 has a depth reaching the source layer SL from the upper surface of the inter-layer insulating film 21. For example, the memory hole MH1 is formed by selectively removing the inter-layer insulating films 13, 15, and 21 and the sacrificial films 17 using anisotropic RIE (Reactive Ion Etching).

The source layer SL is, for example, a portion of a silicon substrate, or a polysilicon layer provided on a silicon substrate (not illustrated) with an inter-layer insulating film (not illustrated) interposed. The inter-layer insulating films 13, 15, and 21 are, for example, silicon oxide films. The sacrificial films 17 are, for example, silicon nitride films.

As shown in FIG. 4B, the semiconductor base SB is formed at the bottom portion of the memory hole MH1. The semiconductor base SB is, for example, silicon that is epitaxially grown on the source layer SL exposed at the bottom surface of the memory hole MH1.

The semiconductor base SB is formed so that an upper surface SBT of the semiconductor base SB is positioned at a level between a sacrificial film 17A and a sacrificial film 17B. Here, the sacrificial film 17B is the sacrificial film 17 of the lowermost layer of the multiple sacrificial films 17. The sacrificial film 17A is the sacrificial film 17 adjacent to the sacrificial film 17B in the Z-direction.

As shown in FIG. 4C, the insulating film 33 is formed on the semiconductor base SB. The insulating film 33 is, for example, a silicon oxide film and is formed by oxidizing a portion of the semiconductor base SB. The insulating film 33 is formed so that the upper surface SBT of the semiconductor base SB is positioned at a level between the sacrificial film 17A and the sacrificial film 17B. When the semiconductor base SB is oxidized, there are also cases where portions of the sacrificial films 17 exposed at the inner wall of the memory hole MH1 also are oxidized; and, for example, thin oxide films (not illustrated) are formed.

As shown in FIG. 5A, a sacrificial layer 35 that fills the interior of the memory hole MH1 is formed. The sacrificial layer 35 is, for example, an amorphous silicon layer deposited using CVD (Chemical Vapor Deposition).

As shown in FIG. 5B, etch-back of the sacrificial layer 35 is performed; and a space ES is formed on the sacrificial layer 35 filling the memory hole MH1. The space ES is formed to be positioned at a level that is higher than a sacrificial film 17T.

As shown in FIG. 5C, the connection portion JP is formed by enlarging the space ES in the horizontal direction. For example, the connection portion JP is formed by etching the inter-layer insulating film 21 using an isotropic etching method.

Figure 6A:
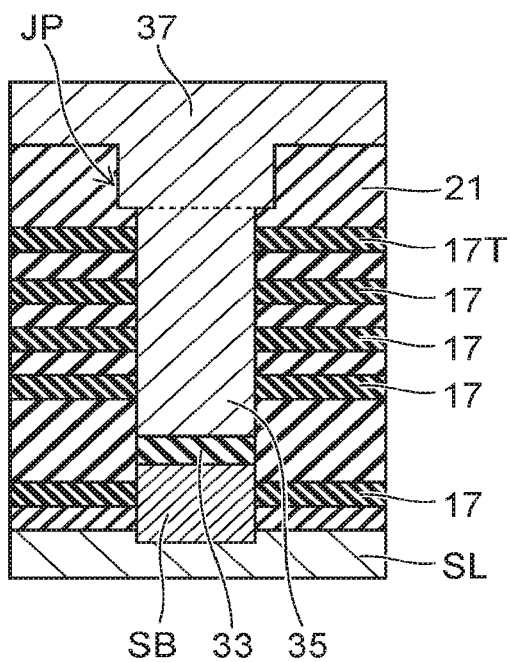

As shown in FIG. 6A, a sacrificial layer 37 that fills the connection portion JP is formed. The sacrificial layer 37 is, for example, an amorphous silicon layer deposited using CVD.

Figure 6B:
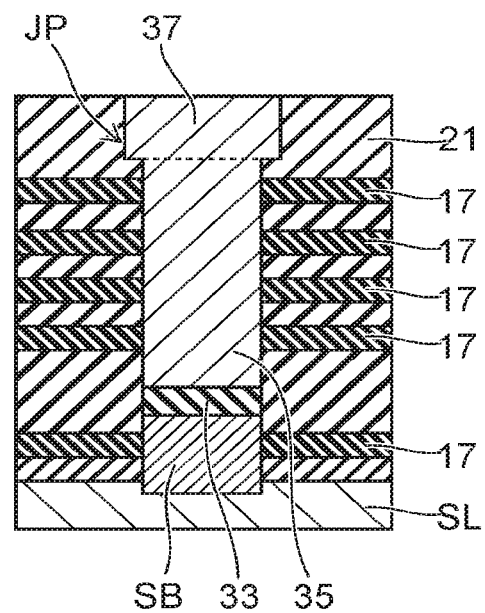

As shown in FIG. 6B, the surface of the inter-layer insulating film 21 is exposed by removing a portion of the sacrificial layer 37. For example, the surfaces of the inter-layer insulating film 21 and the sacrificial layer 37 are planarized by removing a portion of the sacrificial layer 37 by performing etch-back of the sacrificial layer 37 or by using CMP (Chemical Mechanical Polishing).

Figures 7A, 7B:
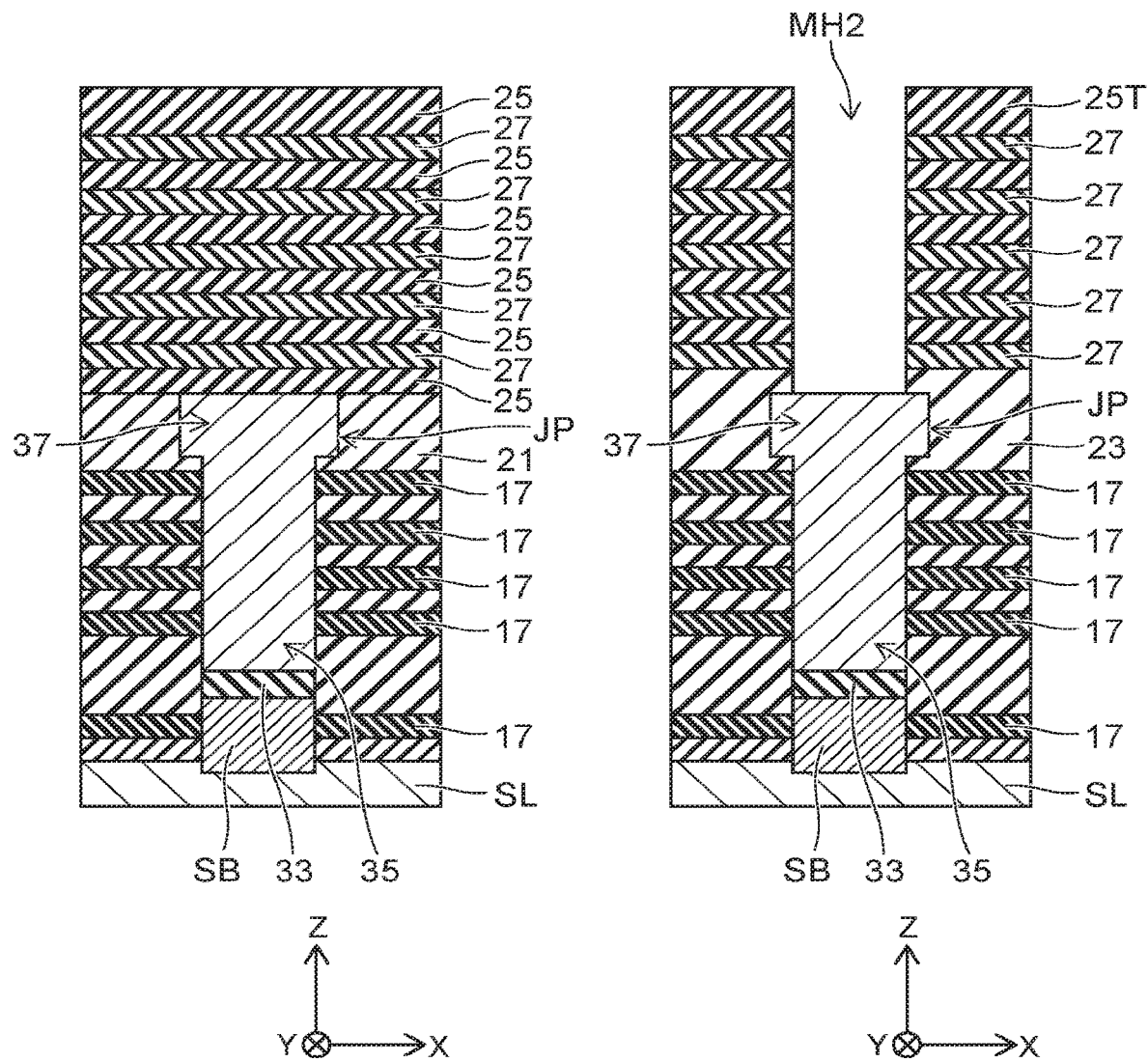

As shown in FIG. 7A, the inter-layer insulating films 25 and sacrificial films 27 are stacked alternately on the inter-layer insulating film 21 and the sacrificial layer 37. The inter-layer insulating films 25 are, for example, silicon oxide films; and the sacrificial films 27 are, for example, silicon nitride films. Here, the inter-layer insulating film 21 and the inter-layer insulating film 25 are formed as one body if both are silicon oxide films. In the following drawings, the inter-layer insulating films 21 and 25 are described as being formed as one body as the inter-layer insulating film 23.

As shown in FIG. 7B, a memory hole MH2 is formed to communicate with the sacrificial layer 37 from the upper surface of an inter-layer insulating film 25T. For example, the memory hole MH2 is formed by selectively removing the inter-layer insulating films 25 and the sacrificial films 27 by using anisotropic RIE. The inter-layer insulating film 25T is the uppermost inter-layer insulating film 25 of the multiple inter-layer insulating films 25.

Figure 8A:
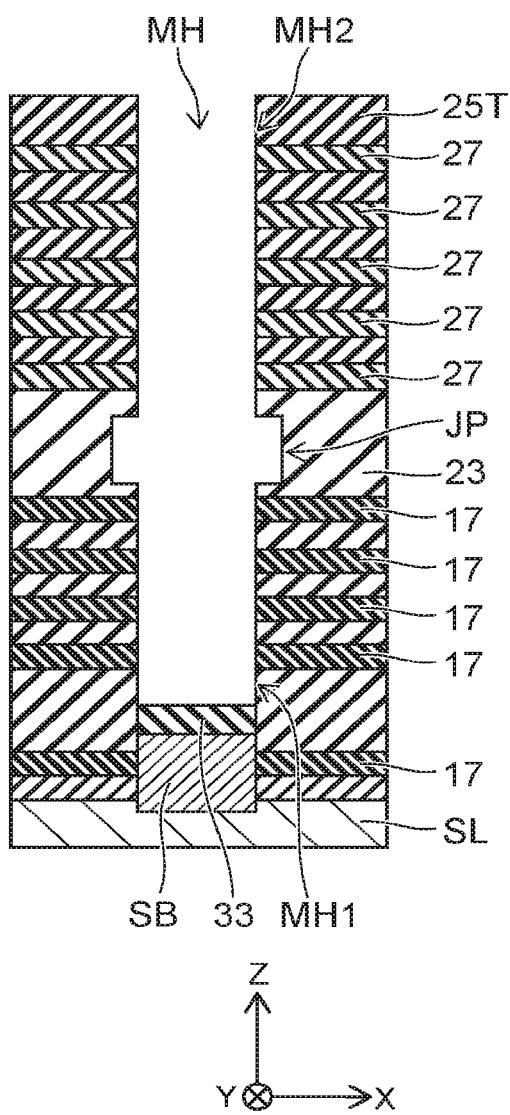

As shown in FIG. 8A, the memory hole MH1 and the memory hole MH2 are formed as one body as a memory hole MH. The memory hole MH is formed by selectively removing the sacrificial layers 35 and 37 via the memory hole MH2. For example, the sacrificial layers 35 and 37 are removed using wet etching.

At this time, the insulating film 33 protects the semiconductor base SB from the etchant of the sacrificial layers 35 and 37. Thereby, the etching of the semiconductor base SB and the lowering of the position of the upper surface SBT of the semiconductor base SB (referring to FIG. 4C) toward the select gate SGS can be avoided (referring to FIG. 2B). However, it should be noted that the formation of the insulating film 33 can be omitted if the tolerance of the upper surface position of the semiconductor base SB with respect to the select gate SGS is large.

In the embodiment, the memory hole MH that reaches the insulating film 33 from the inter-layer insulating film 25T can be formed easily by connecting the memory hole MH1 and the memory hole MH2. For example, in the case where the aspect ratio (the depth divided by the diameter of the bottom surface) of the memory hole MH is large, it is difficult to form a memory hole MH having a uniform diameter in the depth direction. In the embodiment, a memory hole MH having the desired high aspect ratio can be realized by connecting the memory hole MH1 and the memory hole MH2 which have small aspect ratios. Further, the positional alignment of the memory hole MH2 with respect to the memory hole MH1 is easy by providing the connection portion JP which has an enlarged diameter between the memory hole MH1 and the memory hole MH2.

Figure 8B:
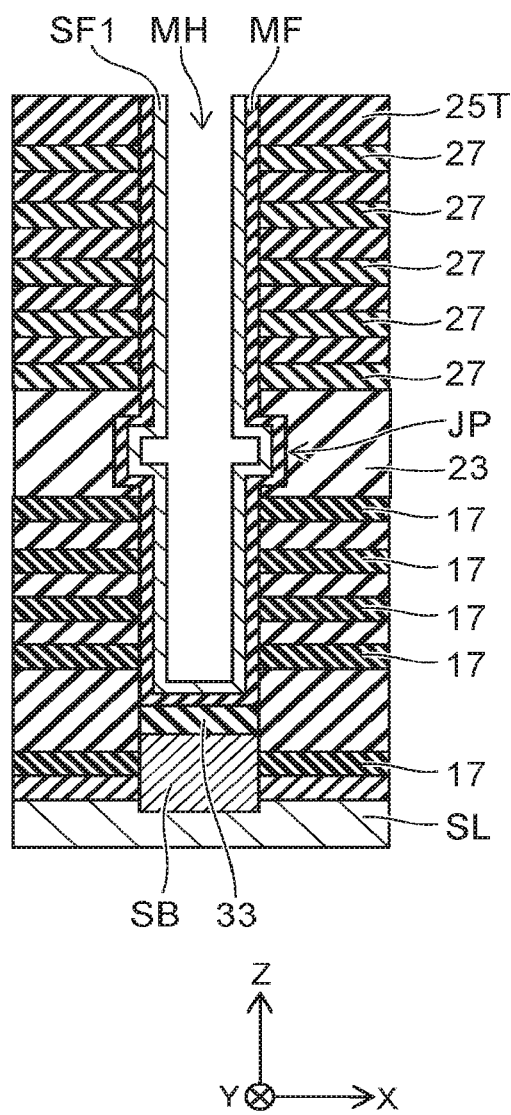

As shown in FIG. 8B, the memory film MF and a semiconductor layer SF1 are formed on the inner surface of the memory hole MH. The memory film MF includes the blocking insulating film BLK, the charge trap film CT, and the tunneling insulating film TN stacked in order on the inner surface of the memory hole MH (referring to FIG. 3). The semiconductor layer SF1 is, for example, an amorphous silicon layer. The semiconductor layer SF1 is stacked on the memory film MF; and the semiconductor layer SF1 is formed so that a space remains in the interior of the memory hole MH.

Figure 9A:
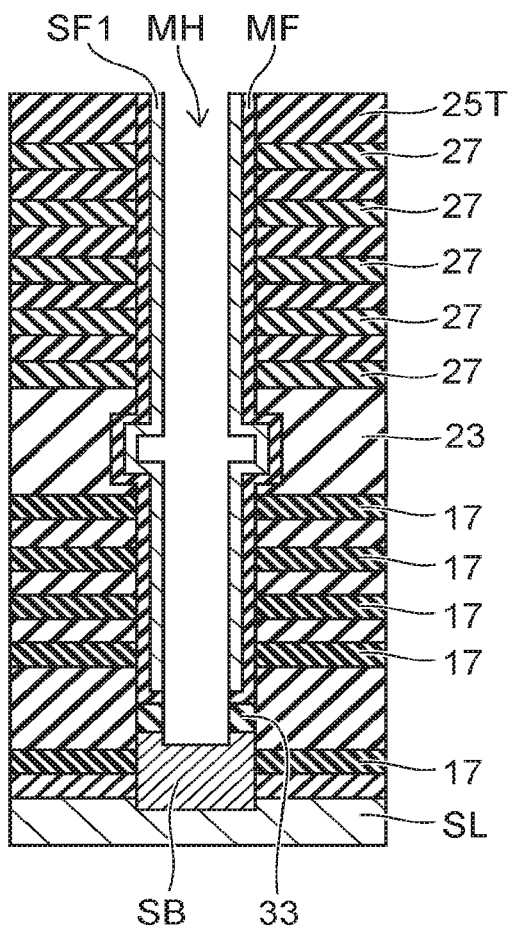

As shown in FIG. 9A, portions of the memory film MF, the semiconductor layer SF, and the insulating film 33 at the bottom surface of the memory hole MH are selectively removed. For example, the memory film MF, the semiconductor layer SF, and the insulating film 33 are selectively removed using anisotropic RIE. Thereby, the semiconductor base SB is exposed at the bottom surface of the memory hole MH. The bottom surface of the memory hole MH is positioned in the interior of the semiconductor base SB; and a recess (a recess portion) is formed in the semiconductor base SB.

Figure 9B:
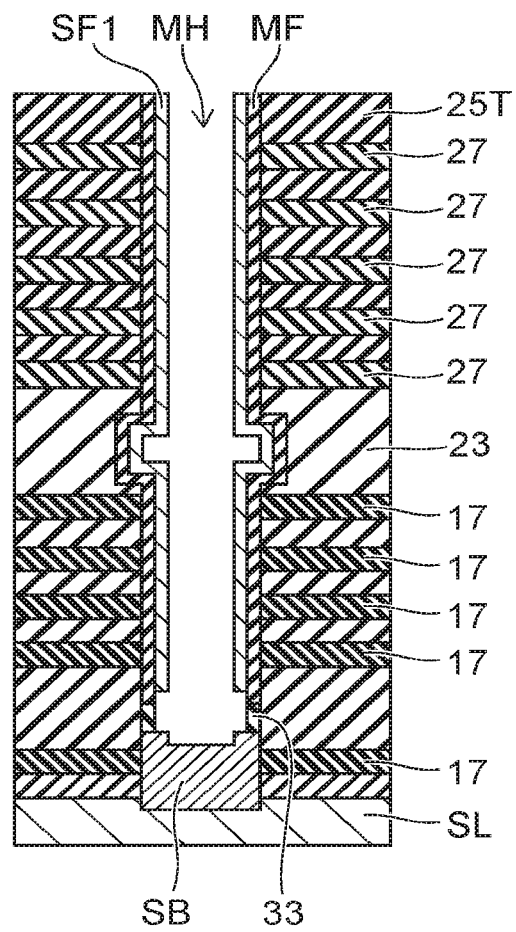

As shown in FIG. 9B, the bottom portion of the memory hole MH is enlarged in the horizontal direction by selectively removing the lower end of the memory film MF and a portion of the insulating film 33 exposed at the wall surface of the memory hole MH. For example, the portions of the memory film MF and the insulating film 33 are removed using isotropic dry etching.

Figure 10A:
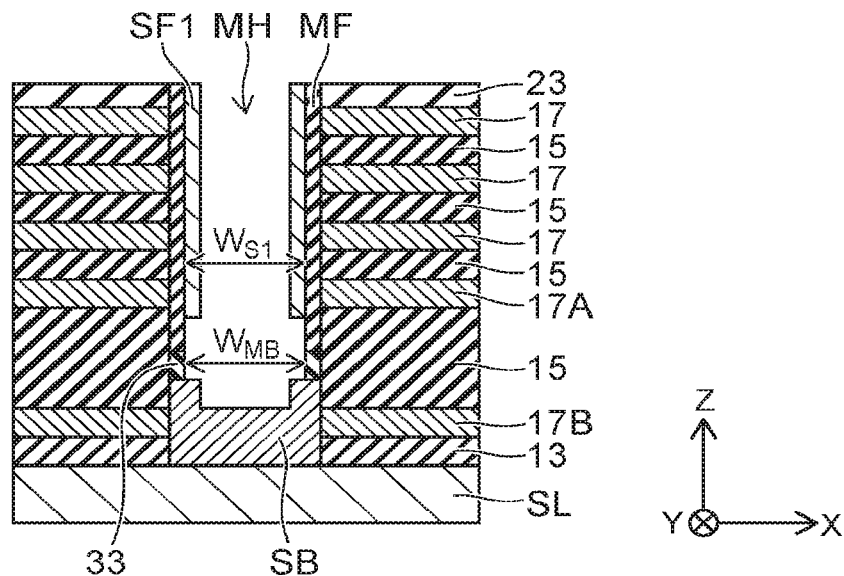

As shown in FIG. 10A, a width $W_{MB}$ in the X-direction of the bottom portion of the memory hole MH is enlarged to be substantially the same as or wider than the width $W_{S1}$ in the X-direction of the outer perimeter of the semiconductor layer SF1 at the level of the sacrificial film 17A.

Figure 10B:
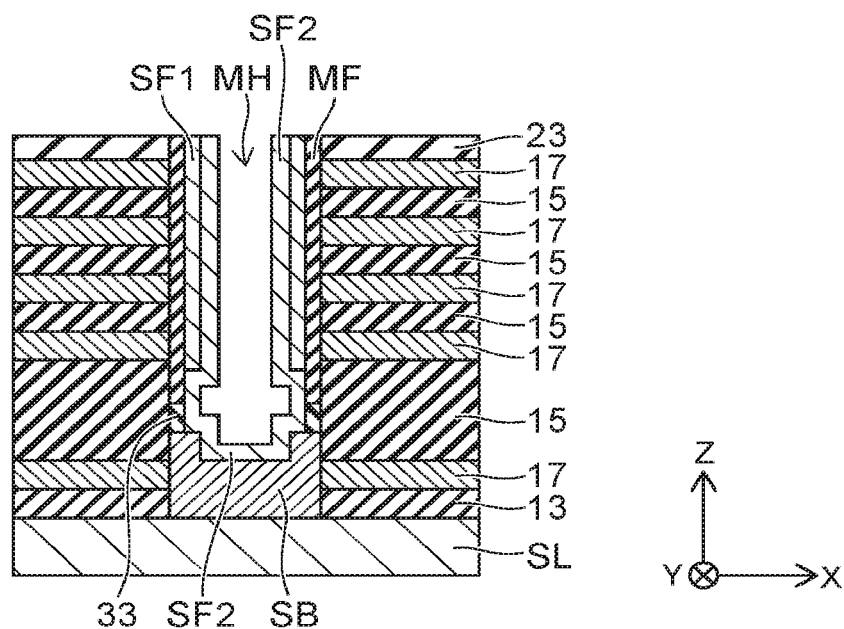

As shown in FIG. 10B, a semiconductor layer SF2 is formed on the inner surface of the memory hole MH. The semiconductor layer SF2 is, for example, an amorphous silicon layer. The semiconductor layer SF2 is formed on the semiconductor layer SF1 and contacts the semiconductor base SB at the bottom surface of the memory hole MH. The contact surface area between the semiconductor layer SF2 and the semiconductor base SB is greater than the surface area of the recess portion formed in the semiconductor base SB.

For example, the semiconductor layer SF2 contacts the surface of the semiconductor base SB that is not damaged by the anisotropic RIE at the enlarged bottom portion of the memory hole MH. Thereby, the contact resistance between the semiconductor layer SF (referring to FIG. 10B) and the semiconductor base SB can be reduced.

Figure 11A:
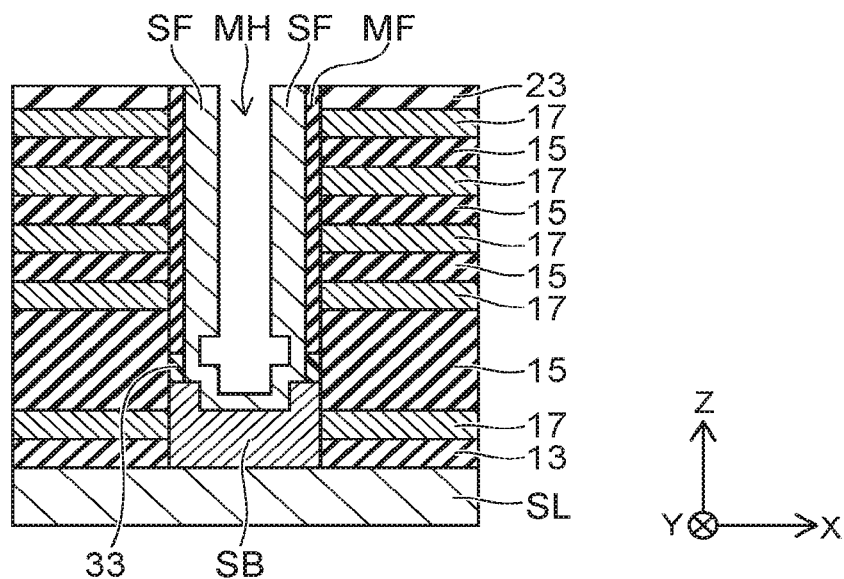

As shown in FIG. 11A, the semiconductor layer SF is formed in which the semiconductor layer SF1 and the semiconductor layer SF2 are formed as one body. For example, the semiconductor layer SF is formed by performing heat treatment to change the semiconductor layers SF1 and SF2 which are amorphous silicon layers into a polysilicon layer.

Figure 11B:
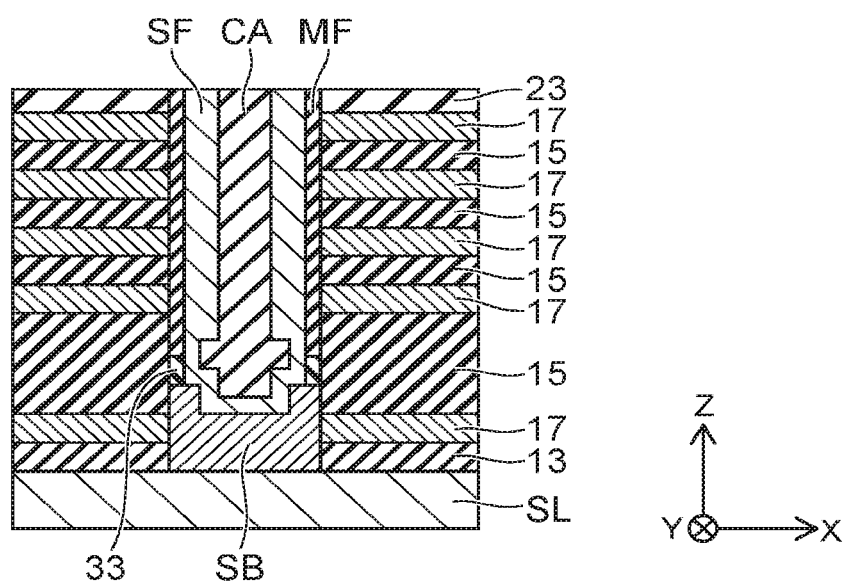

As shown in FIG. 11B, the insulating core CA that is filled into the interior of the memory hole MH is formed. The insulating core CA is, for example, silicon oxide deposited using CVD.

Figure 12A:
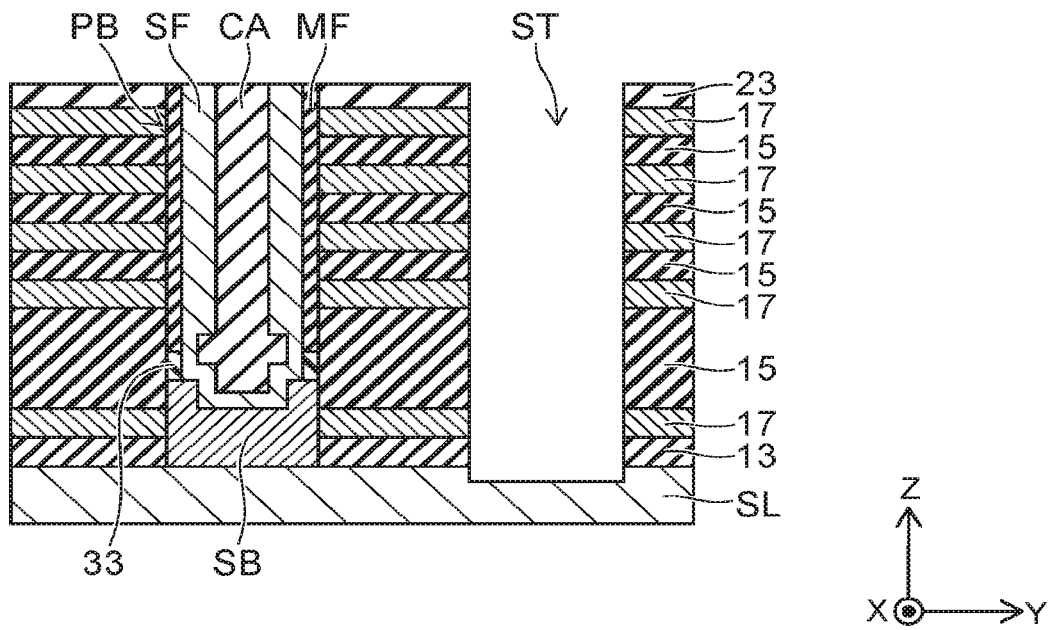

As shown in FIG. 12A, a slit ST that divides the inter-layer insulating films 13, 15, and 23 and the sacrificial films 17 is formed. For example, the slit ST is formed by selectively removing the inter-layer insulating films 13, 15, and 23 and the sacrificial films 17 by using anisotropic RIE. The slit ST extends in the X-direction and has a depth reaching the source layer SL from the upper surface of the inter-layer insulating film 25T (referring to FIG. 9B). In other words, the slit ST also divides the not-illustrated inter-layer insulating films 25 and the not-illustrated sacrificial films 27.

Figure 12B:
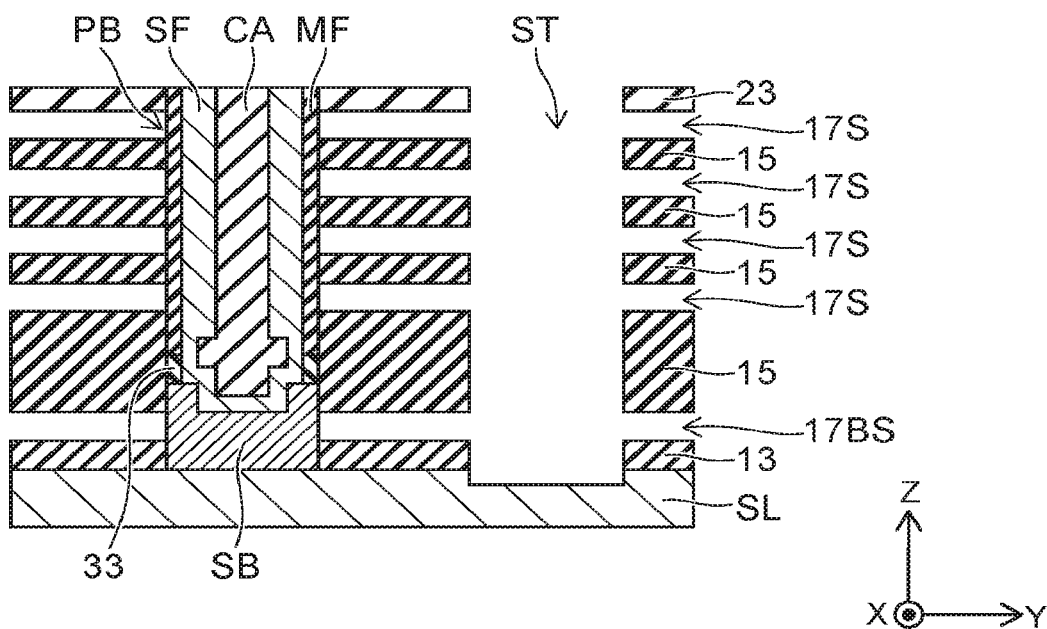

As shown in FIG. 12B, the sacrificial films 17 are selectively removed; and spaces 17S are formed between the inter-layer insulating film 13 and the inter-layer insulating film 15, between the inter-layer insulating films 15 adjacent to each other in the Z-direction, and between the inter-layer insulating film 15 and the inter-layer insulating film 23. For example, the sacrificial films 17 are removed by supplying an etchant via the slit ST. At this time, the sacrificial films 17 are selectively removed with respect to the inter-layer insulating films 13, 15, and 23. The sacrificial films 27 also are selectively removed at a not-illustrated portion.

The columnar body PB supports the inter-layer insulating films 15, 23, and 25 in the memory cell region MCR and maintains the space between the inter-layer insulating films. Also, the columnar support body SP (referring to FIG. 3) supports the inter-layer insulating films 15, 23, and 25 in the draw-out region HUR and maintains the space between the inter-layer insulating films.

Figure 13A:
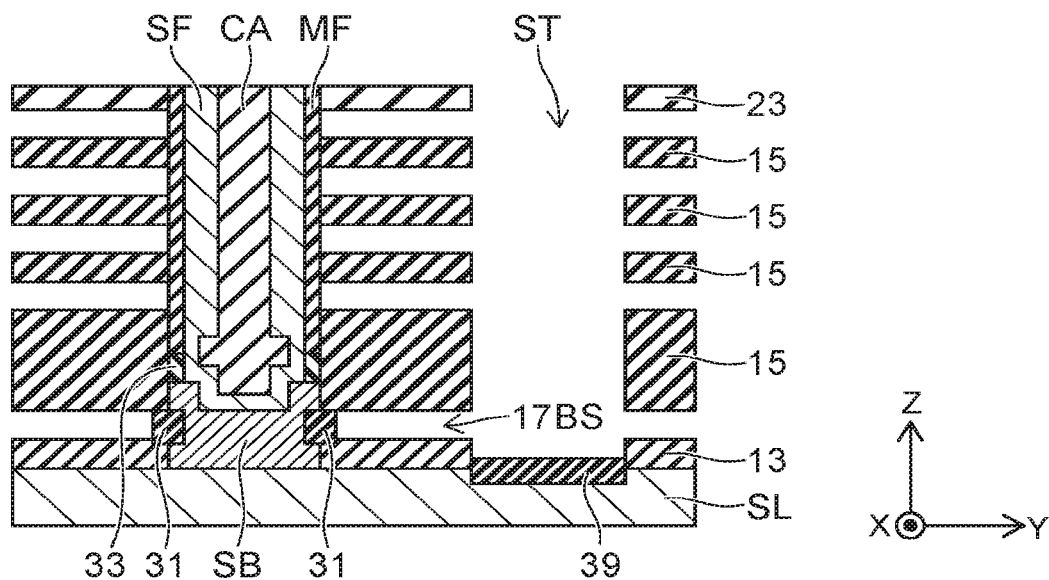

As shown in FIG. 13A, the insulating film 31 is formed on the side surface of the semiconductor base SB. The insulating film 31 is, for example, a silicon oxide film and is formed by oxidizing a portion of the semiconductor base SB via a space 17BS. At this time, a portion of the source layer SL exposed at the bottom surface of the slit ST also is oxidized; and an insulating film 39 is formed. Here, the space 17BS is formed by removing the sacrificial film 17B at the position most proximal to the source layer SL; and a portion of the side surface of the semiconductor base SB is exposed in the interior of the space 17BS.

Figure 13B:
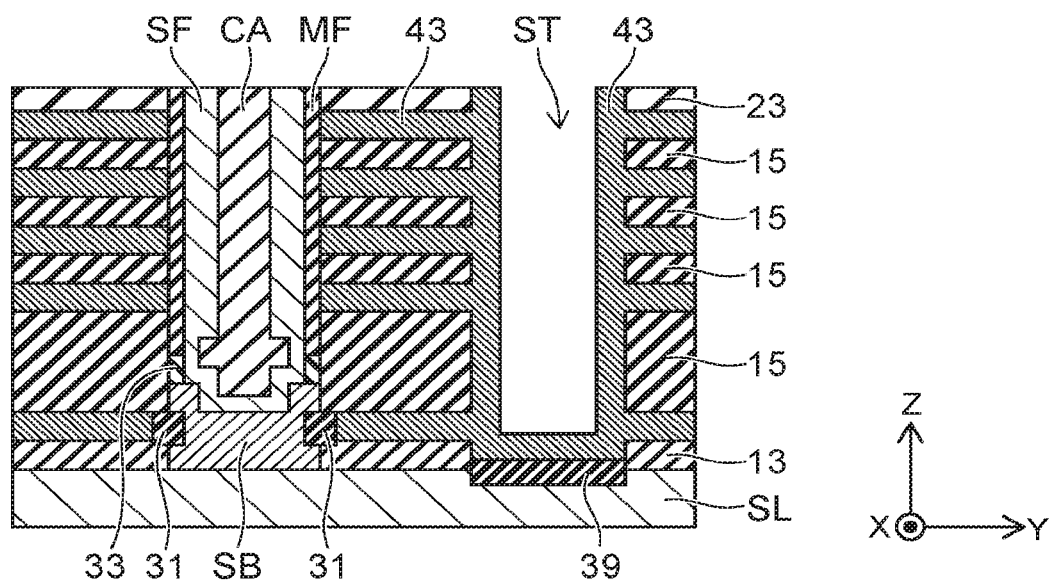

As shown in FIG. 13B, a metal layer 43 is formed in the interior of the spaces 17S (referring to FIG. 12B). The metal layer 43 includes, for example, tungsten (W) deposited using CVD. The source gas of the metal layer 43 is supplied to the interiors of the spaces 17S via the slit ST.

Figure 14A:
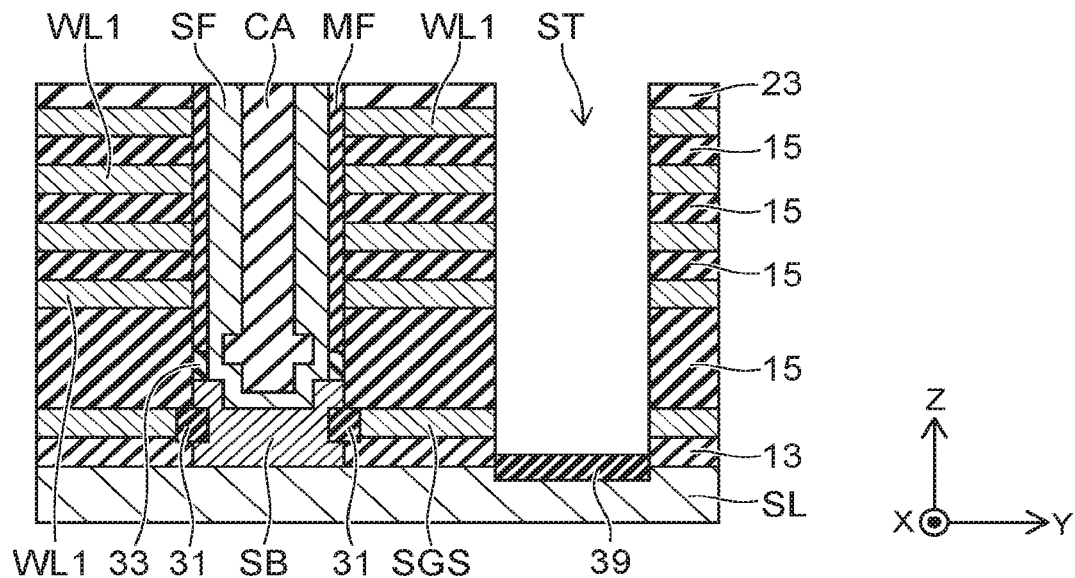

As shown in FIG. 14A, the word lines WL1 and the select gate SGS are formed by removing the portion of the metal layer 43 deposited on the inner surface of the slit ST. The word lines WL2 and the select gate SGD also are formed at a not-illustrated portion.

Figure 14B:
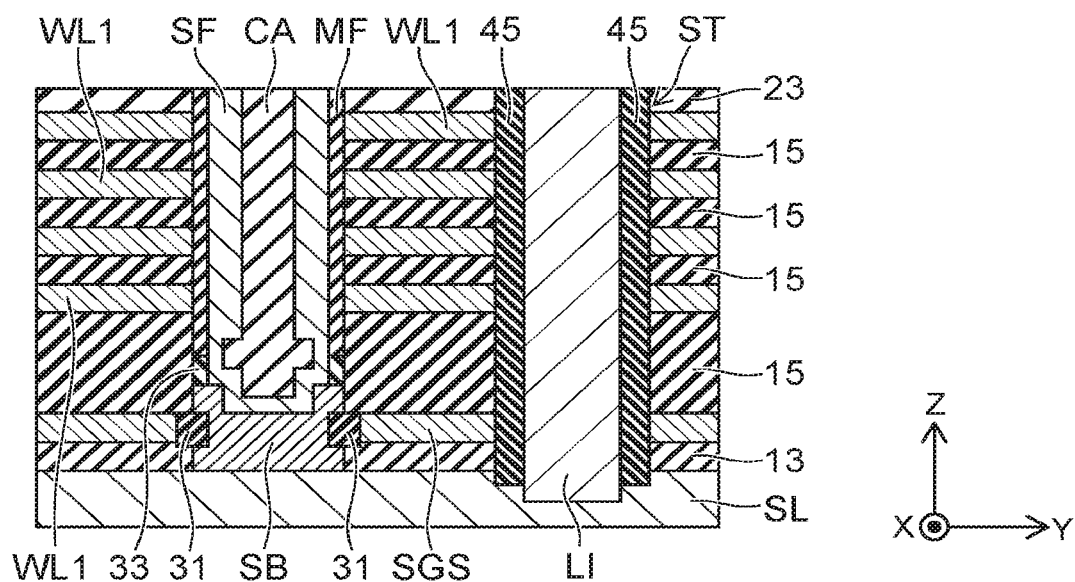

As shown in FIG. 14B, a source contact LI is formed in the interior of the slit ST. The source contact LI is connected to the source layer SL at the bottom surface of the slit ST. The source contact LI is, for example, a metal such as tungsten (W), etc., and electrically connects the source layer SL to an interconnect of the upper layer (not illustrated).

The source contact LI is electrically insulated from the word lines WL and the select gates SGS and SGD by an insulating film 45. The insulating film 45 is, for example, a silicon oxide film and is provided on the inner wall of the slit ST.

Continuing, the contact plugs CC and the interconnects of the upper layers that are connected respectively to the word lines WL and the select gates SGS and SGD (referring to FIG. 1) are formed; and the memory device 1 is completed.

Figure 15:
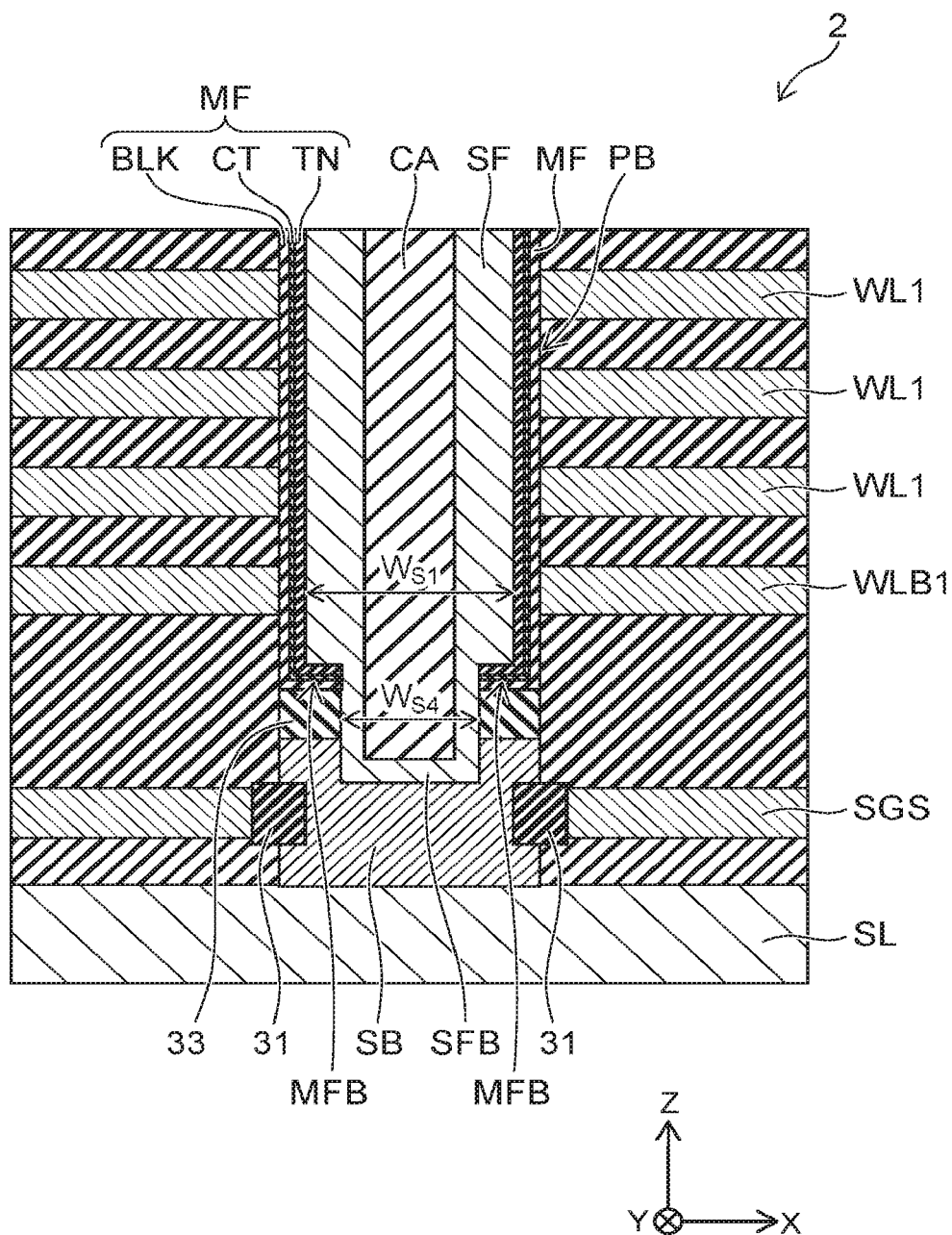
FIG. 15 is a schematic cross-sectional view showing a memory device according to a variation of the first embodiment.

FIG. 15 is a schematic cross-sectional view showing a memory device 2 according to a modification of the first embodiment. FIG. 15 is a schematic cross-sectional view of the lower portion of the columnar body PB.

In the memory device 2 as shown in FIG. 15, a width $W_{S4}$ in the X-direction of the outer perimeter of the lower end of the semiconductor layer SF is provided to be narrower than the width $W_{S1}$ in the X-direction of the outer perimeter of the portion crossing the word line WLB1. In other words, the memory film MF includes a lower end MFB extending toward the insulating core CA; and the entire width of the portion of the semiconductor layer SF and the insulating core CA piercing the insulating film 33 also is formed to be narrow. For example, such a structure is formed by omitting the process of enlarging the bottom portion of the memory hole MH in the horizontal direction shown in FIG. 9B.

In the memory device 2, for example, there are cases where the current (hereinbelow, the cell current) that flows through the semiconductor layer SF when reading data from the memory cells MC is blocked by the insulating film 33 and the lower end MFB of the memory film MF. Conversely, in the memory device 1 shown in FIG. 3, the lower end MFB of the memory film MF is removed; and the portion of the semiconductor layer SF piercing the insulating film 33 is enlarged in the horizontal direction. Thereby, the channel resistance between the semiconductor layer SF and the semiconductor base SB is reduced; and the cell current can be increased.

Figure 16:
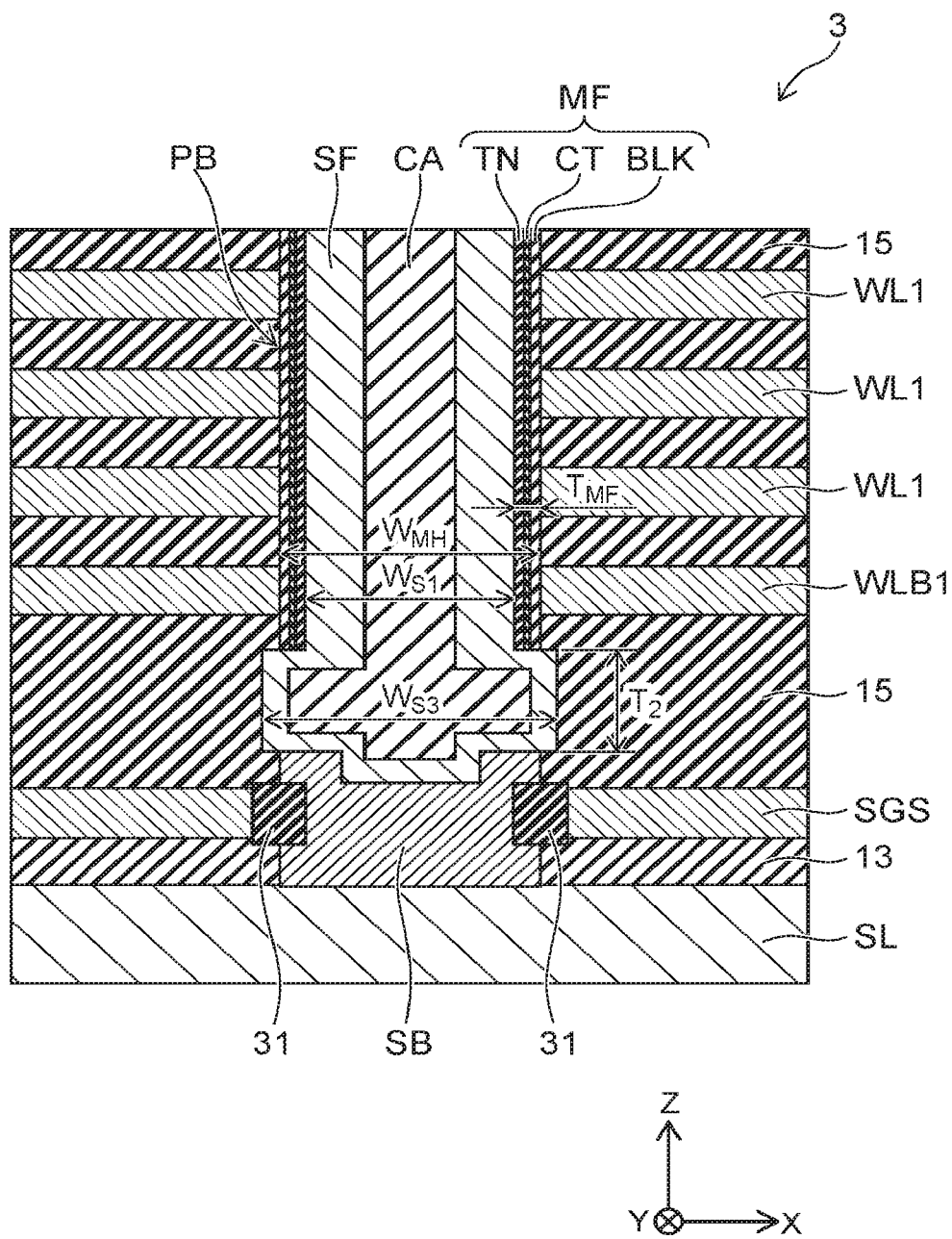
FIG. 16 is a schematic cross-sectional view showing a memory device according to a variation of the first embodiment.

FIG. 16 is a schematic cross-sectional view showing a memory device 3 according to a modification of the first embodiment. FIG. 16 is a schematic cross-sectional view of the lower portion of the columnar body PB.

In the memory device 3 as shown in FIG. 16, the lower portion of the semiconductor layer SF positioned between the semiconductor base SB and the memory film MF is provided to contact the inter-layer insulating film 15. The width $W_{S2}$ in the X-direction of the outer perimeter of the semiconductor layer SF at the lower end of the memory film MF (referring to FIG. 3) is substantially the same as the width $W_{S1}$ in the X-direction of the outer perimeter of the portion of the semiconductor layer SF crossing the word line WLB1. For example, such a structure is formed by completely removing the insulating film 33 and the lower end MFB of the memory film MF (referring to FIG. 15) in the process of enlarging the bottom portion of the memory hole MH shown in FIG. 9B.

The width $W_{S3}$ in the X-direction of the outer perimeter of the semiconductor layer SF contacting the inter-layer insulating film 15 is substantially the same as or wider than a width $W_{MH}$ in the X-direction of the outer perimeter of the memory film MF at the level of the word line WLB1. A spacing $T_2$ between the upper surface of the semiconductor base SB and the lower end of the charge trap film CT is wider than a film thickness $T_{MF}$ of the memory film MF. For example, in the case where the horizontal cross section of the memory hole MH is substantially a circle, $W_{MH}$ is the diameter of the memory hole MH.

In the memory device 3, the width $W_{S3}$ of the outer perimeter of the semiconductor layer SF at the lower end of the memory film MF can be set to be substantially the same as the width $W_{S1}$ of the outer perimeter of the semiconductor layer SF at the level of the word line WLB1; and the channel resistance between the semiconductor layer SF and the semiconductor base SB can be reduced and the cell current can be large by enlarging, in the horizontal direction, the portion of the semiconductor layer SF positioned between the memory film MF and the semiconductor base SB.

Figure 17:
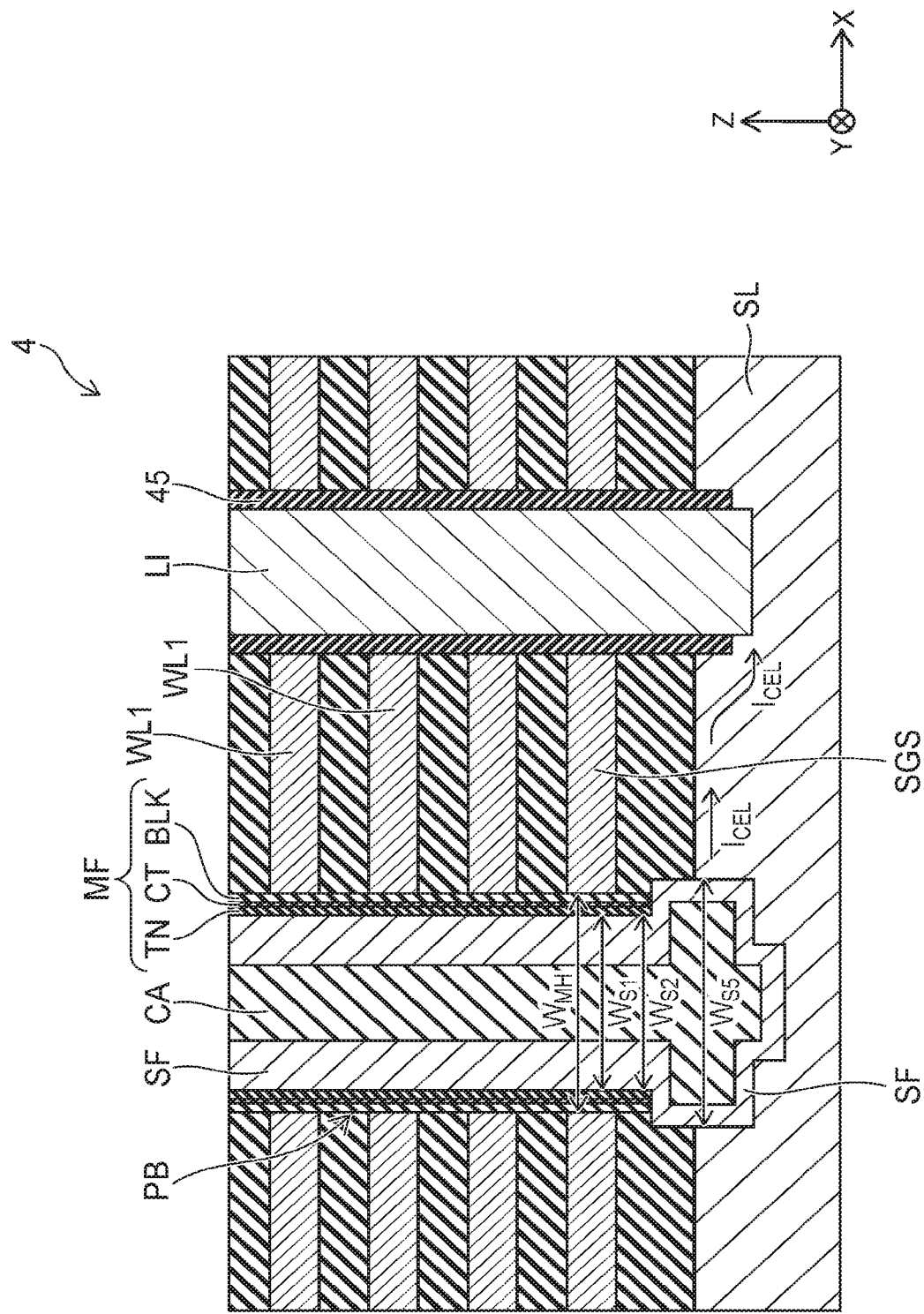
FIG. 17 is a schematic cross-sectional view showing a memory device according to a variation of the first embodiment.

FIG. 17 is a schematic cross-sectional view showing a memory device 4 according to a modification of the first embodiment. FIG. 17 is a schematic cross-sectional view showing the lower portions of the columnar body PB and the source contact LI.

In the memory device 4 as shown in FIG. 17, the semiconductor base SB is not provided; and the semiconductor layer SF is directly connected to the source layer SL. The width $W_{S3}$ in the X-direction of the outer perimeter of the semiconductor layer SF at the lower end of the memory film MF is set to be substantially the same as the width $W_{S1}$ in the X-direction of the outer perimeter of the semiconductor layer SF at the level crossing the select gate SGS; and the portion of the semiconductor layer SF contacting the source layer SL is enlarged in the horizontal direction. The lower end of the memory film MF is positioned at a level between the source layer SL and the select gate SGS.

For example, the memory device 4 can be formed by omitting the formation of the semiconductor base SB and the formation of the insulating film 33 shown in FIGS. 4B and 4C. Also, the lower end MFB of the memory film MF (referring to FIG. 15) is removed completely in the process of enlarging the bottom portion of the memory hole MH shown in FIG. 9B. Thereby, for example, a maximum width $W_{SS}$ of the outer perimeter of the portion of the semiconductor layer SF contacting the source layer SL is formed to be substantially the same as or wider than the width $W_{MH}$ in the X-direction of the outer perimeter of the memory film MF at the level of the select gate SGS.

In the memory device 4 as well, the channel resistance at the lower end of the semiconductor layer SF can be reduced. Also, the contact resistance between the semiconductor layer SF and the source layer SL can be reduced because a portion of the semiconductor layer SF contacts a portion of the source layer SL not damaged by the RIE. Thereby, a cell current $I_{CEL}$ that flows in the source contact LI from the semiconductor layer SF via the source layer SL can be increased.

In the embodiment as recited above, the bottom portion of the memory hole MH is enlarged by partially removing the insulating film 33 and the lower end MFB of the memory film MF. Thereby, the resistance of the semiconductor layer SF provided in the interior of the memory hole MH can be reduced. For example, even in the case where the number of stacks of the word lines WL increases and the entire channel length of the memory cells MC increases, it is possible to prevent the decrease of the cell current by reducing the channel resistance at the lower portion of the semiconductor layer SF.

Second Embodiment

FIG. 18A to FIG. 26B are schematic cross-sectional views showing manufacturing processes of a memory device 5 according to a second embodiment (referring to FIGS. 26A and 26B). The drawings are schematic cross-sectional views showing the manufacturing processes of the columnar body PB and the columnar support body SP.

Figures 18A, 18B:
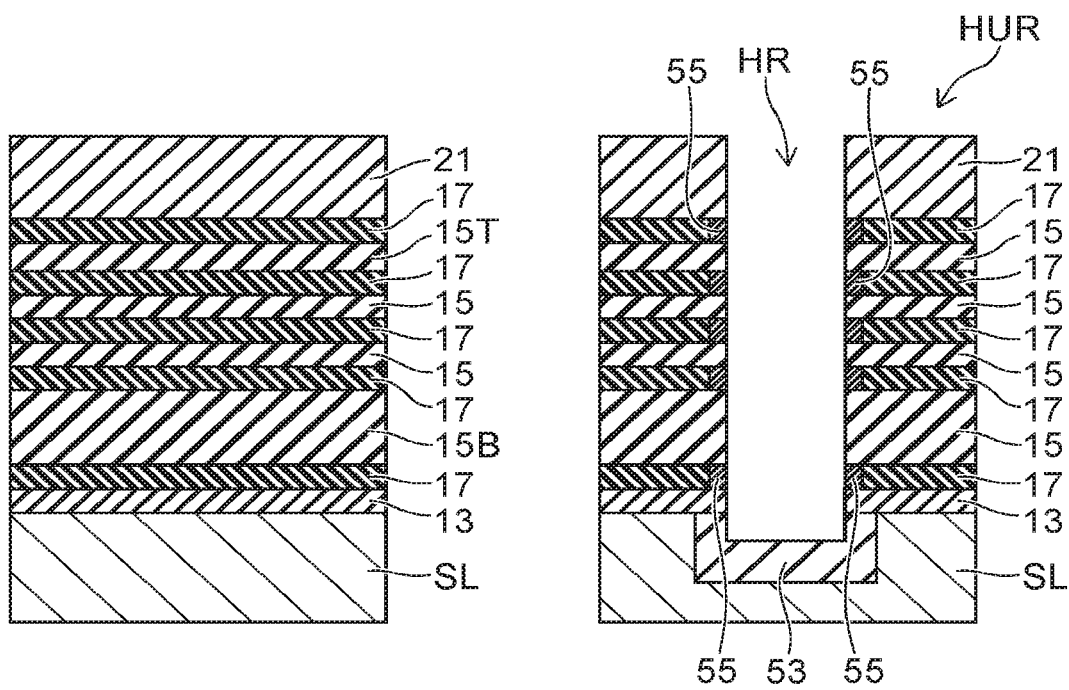

As shown in FIG. 18A, the inter-layer insulating films 13, 15, and 21 and the sacrificial films 17 are stacked on the source layer SL. The sacrificial films 17 are provided between the inter-layer insulating film 13 and the inter-layer insulating film 15B, between the inter-layer insulating films 15 adjacent to each other in the Z-direction, and between the inter-layer insulating film 15T and the inter-layer insulating film 21.

As shown in FIG. 18B, a support hole HR is formed at a portion used to form the draw-out region HUR. The support hole HR has a depth reaching the source layer SL from the upper surface of the inter-layer insulating film 21. Continuing, an insulating film 53 is formed by oxidizing the source layer SL exposed at the bottom surface of the support hole HR. The insulating film 53 is, for example, a silicon oxide film.

In this process, the end surfaces of the sacrificial films 17 exposed at the inner wall of the support hole HR also are oxidized; and insulating films 55 are formed. The sacrificial films 17 are, for example, silicon nitride films; and the insulating films 55 are, for example, silicon oxide films. For example, the insulating film 53 may be deposited on the inner surface of the support hole HR using CVD.

Figures 19A, 19B:
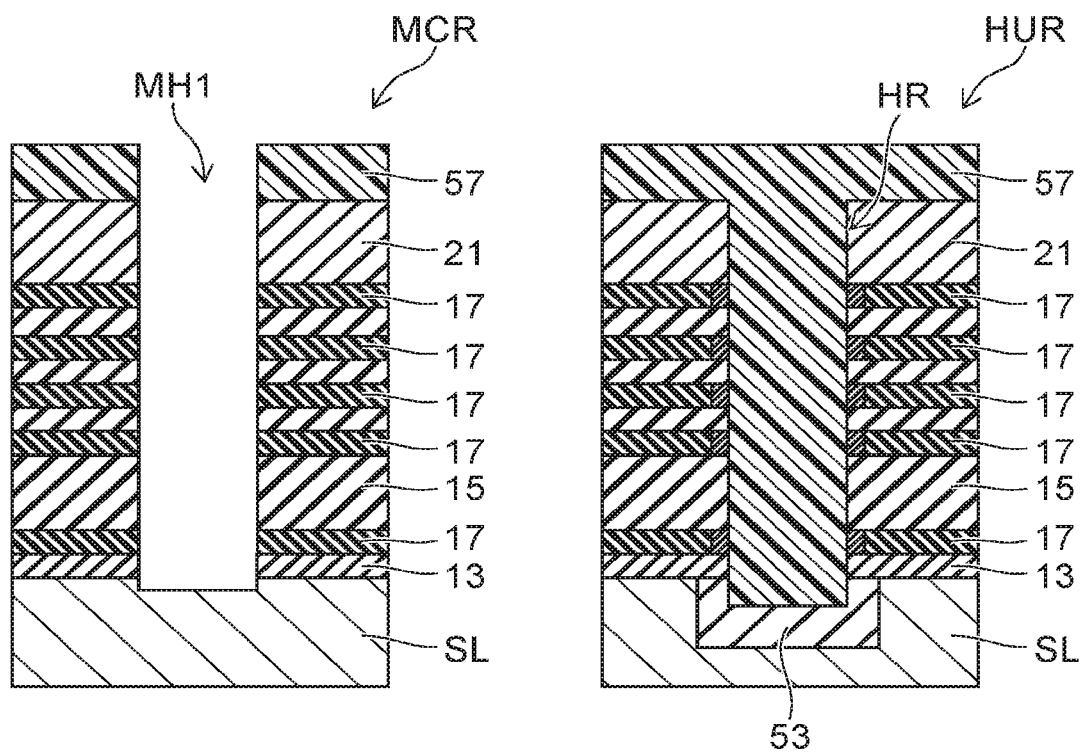

As shown in FIG. 19A, the memory hole MH1 is formed at a portion used to form the memory cell region MCR. The memory hole MH1 has a depth reaching the source layer SL from the upper surface of the inter-layer insulating film 21.

For example, the memory hole MH1 is formed by selectively removing the inter-layer insulating films 13, 15, and 21 and the sacrificial films 17 by using a resist mask 57. As shown in FIG. 19B, the support hole HR is protected by the resist mask 57 during the selective removal.

Figures 20A, 20B:
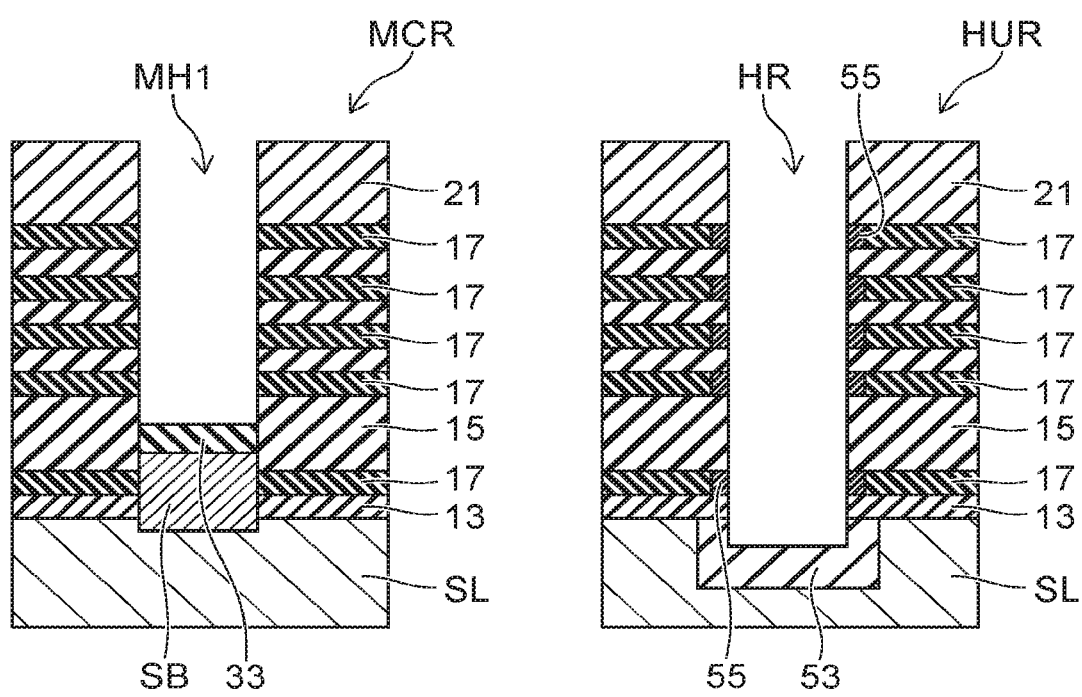

As shown in FIG. 20A, the semiconductor base SB is formed at the bottom portion of the memory hole MH1. The semiconductor base SB is epitaxially grown on the source layer SL exposed at the bottom portion of the memory hole MH1. As shown in FIG. 20B, the semiconductor base SB is not formed because the source layer SL is not exposed in the interior of the support hole HR.

Further, the insulating film 33 is formed by oxidizing the semiconductor base SB in the memory hole MH1. In the support hole HR, the oxidization of the source layer SL and the sacrificial films 17 progresses; and the film thicknesses of the insulating films 53 and 55 become thick. Although the sacrificial films 17 that are exposed at the inner wall of the memory hole MH1 also are oxidized in the oxidization, insulating films that are formed on the end surfaces of the sacrificial films 17 inside the memory hole MH1 are not illustrated in FIG. 20A and subsequent drawings.

Figures 21A, 21B:
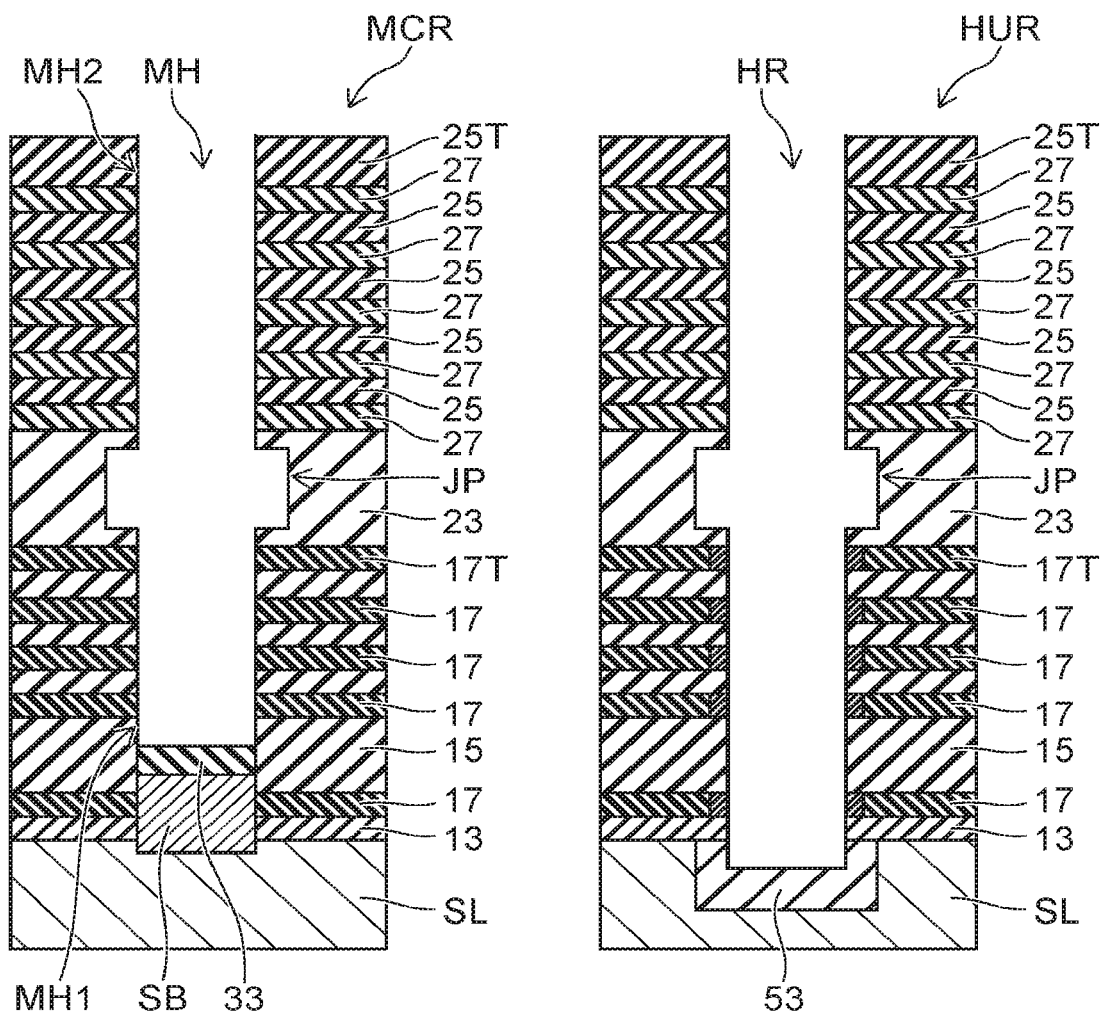

As shown in FIG. 21A, the inter-layer insulating films 23 and 25 and the sacrificial films 27 are formed on the sacrificial film 17T; and the memory hole MH that has a depth reaching the insulating film 33 from the upper surface of the inter-layer insulating film 25T is formed. The connection portion JP is formed in the interior of the inter-layer insulating film 23. This process is the same as the manufacturing processes shown in FIG. 5A to FIG. 8A.

As shown in FIG. 21B, the support hole HR that has a depth reaching the insulating film 53 from the upper surface of the inter-layer insulating film 25T is formed in the draw-out region HUR.

Figures 22A, 22B:
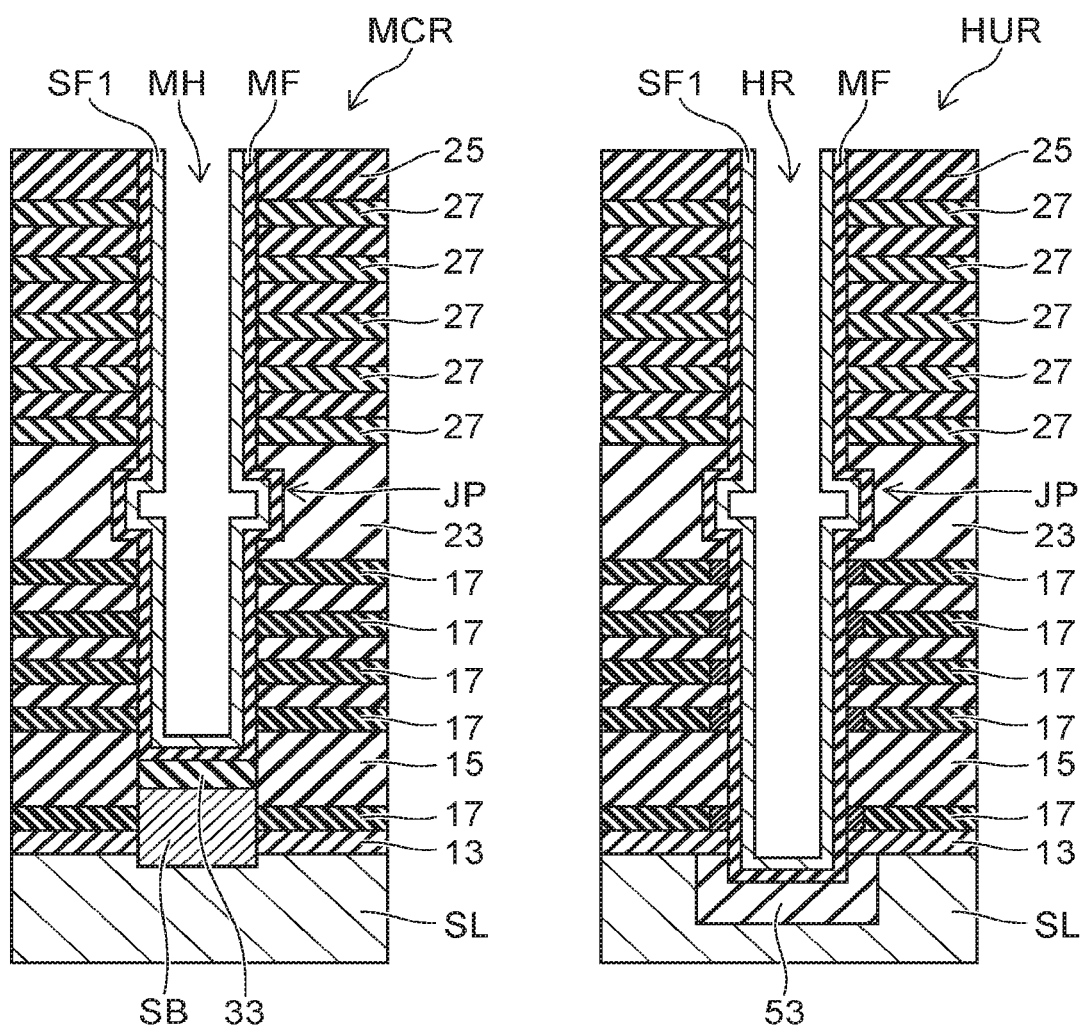

As shown in FIG. 22A, the memory film MF and the semiconductor layer SF1 are stacked on the inner surface of the memory hole MH. For example, the memory film MF has a structure in which the blocking insulating film BLK, the charge trap film CT, and the tunneling insulating film TN are stacked (referring to FIG. 3). The semiconductor layer SF1 is, for example, an amorphous silicon layer and is formed on the memory film MF.

As shown in FIG. 22B, the memory film MF and the semiconductor layer SF1 are formed also on the inner surface of the support hole HR.

Figures 23A, 23B:
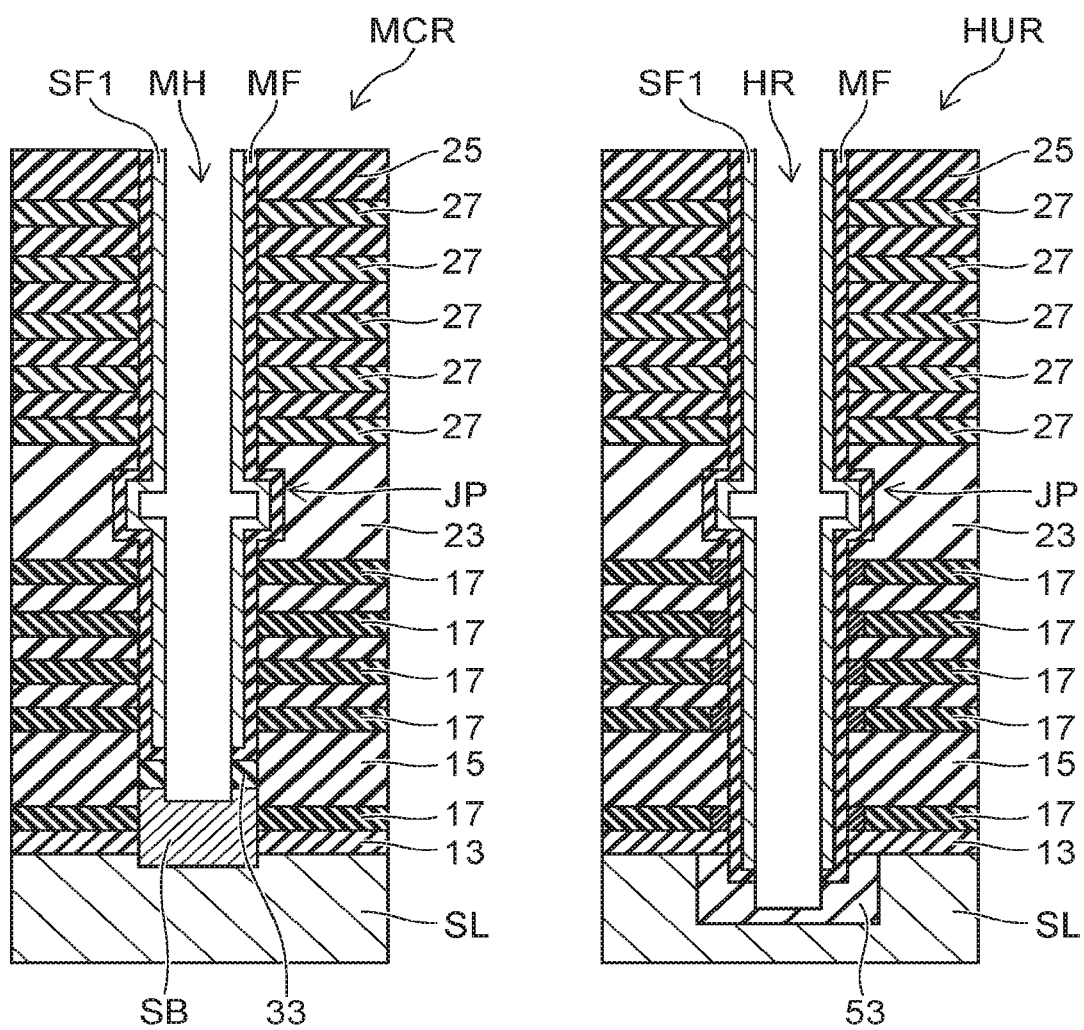

As shown in FIG. 23A, portions of the semiconductor layer SF1, the memory film MF, and the insulating film 33 are selectively removed at the bottom surface of the memory hole MH. Thereby, a portion of the semiconductor base SB is exposed at the bottom surface of the memory hole MH.

Also, as shown in FIG. 23B, portions of the semiconductor layer SF1, the memory film MF, and the insulating film 53 are selectively removed at the bottom surface of the support hole HR. The insulating film 53 has a thickness such that the source layer SL is not exposed at the bottom surface of the support hole HR.

As shown in FIG. 24A, portions of the insulating film 33 and the lower end of the memory film MF are removed; and the bottom portion of the memory hole MH is enlarged in the horizontal direction.

Also, as shown in FIG. 24B, portions of the insulating film 53 and the lower end of the memory film MF are removed at the bottom portion of the support hole HR. After this process as well, the insulating film 53 is provided to be interposed between the source layer SL and the bottom portion of the support hole HR.

As shown in FIG. 25A, the semiconductor layer SF2 that covers the inner surface of the memory hole MH is formed.

The semiconductor layer SF2 is formed to contact the semiconductor base SB and the semiconductor layer SF1.

As shown in FIG. 25B, the semiconductor layer SF2 that covers the inner surface of the support hole HR is formed. In the support hole HR, the semiconductor layer SF2 is not connected to the source layer SL because the insulating film 53 is interposed.

As shown in FIG. 26A, the insulating core CA is formed in the interior of the memory hole MH after forming the semiconductor layer SF in which the semiconductor layers SF1 and SF2 are formed as one body. For example, the semiconductor layers SF1 and SF2 are converted into a polysilicon layer by heat treatment and are formed as one body. A capping layer SC is filled onto the insulating core CA. The capping layer SC is, for example, an amorphous silicon layer.

As shown in FIG. 26B, the semiconductor layer SF, the insulating core CA, and the capping layer SC are formed also in the interior of the support hole HR. The semiconductor layer SF is electrically insulated from the source layer SL by the insulating film 53.

Then, the word lines WL and the select gates SGS and SGD are formed by the manufacturing processes shown in FIGS. 12A to 14B. In the embodiment, the semiconductor layer SF that is provided in the interior of the columnar support body SP is electrically insulated from the source layer SL by the insulating film 53. For example, even in the case where the contact plug CC contacts the semiconductor layer SF due to positional shift of the mask alignment, etc., the electrical insulation between the source layer SL and the contact plug CC can be maintained.

Third Embodiment

Figure 27:
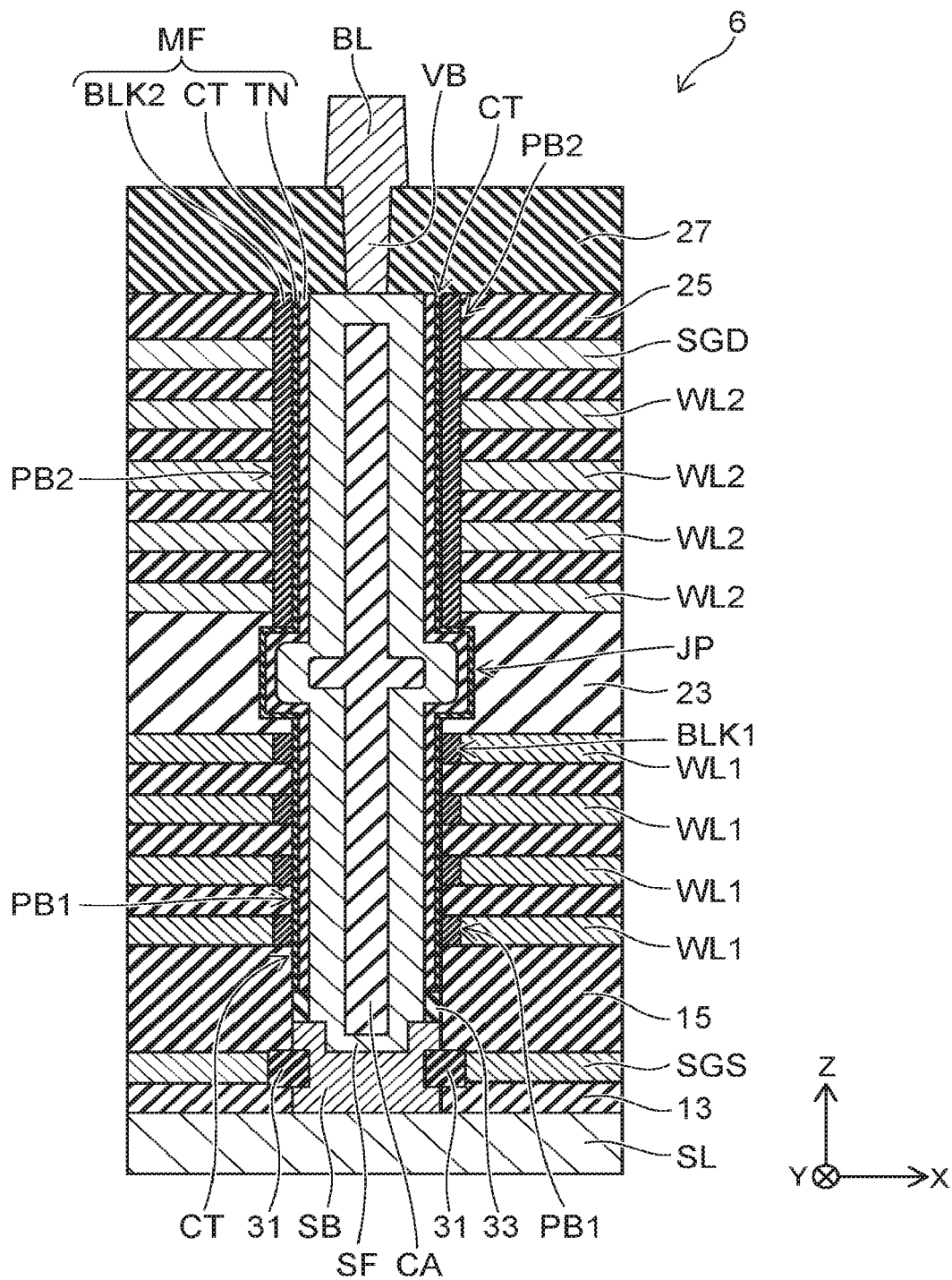
FIG. 27 is a schematic cross-sectional view showing a memory device 6 according to a third embodiment.

FIG. 27 is a schematic cross-sectional view showing a memory device 6 according to a third embodiment. FIG. 27 is a schematic view showing a cross section of the columnar body PB. In the memory device 6, the structure of the memory film MF is different between the columnar portion PB1 that is positioned lower than the connection portion JP and the columnar portion PB2 that is positioned higher than the connection portion JP.

In the columnar portion PB1 as shown in FIG. 27, the blocking insulating films BLK are provided respectively between the charge trap film CT and the word lines WL1 and are separated from each other in the Z-direction. Conversely, in the columnar portion PB2, the blocking insulating film BLK is provided to extend to be continuous in the Z-direction between the charge trap film CT and the word lines WL2. The charge trap film CT and the tunneling insulating film TN are provided to extend in the Z-direction along the semiconductor layer SF.

A method for manufacturing the memory device 6 according to the third embodiment will now be described with reference to FIG. 28A to FIG. 32B. FIG. 28A to FIG. 32B are schematic cross-sectional views showing manufacturing processes of the memory device 6.

As shown in FIG. 28A, the insulating film 33 and blocking insulating films BLK1 are formed in the interior of the memory hole MH1 in which the semiconductor base SB is formed. The insulating film 33 is, for example, a silicon oxide film and is formed by oxidizing a portion of the semiconductor base SB. The blocking insulating films BLK1 are, for example, silicon oxide films and are formed by oxidizing the sacrificial films 17 exposed at the inner wall of the memory hole MH1. The insulating film 33 and the blocking insulating films BLK1 are formed simultaneously; and the film thicknesses of the insulating film 33 and the blocking insulating films BLK1 are controlled by the oxidization time of the semiconductor base SB and the sacrificial films 17.

As shown in FIG. 28B, after forming the sacrificial layer 35 in the interior of the memory hole MH1, the connection portion JP is formed; and the sacrificial layer 37 is formed in the interior of the connection portion JP (referring to FIG. 5A to FIG. 6B). The sacrificial layers 35 and 37 are, for example, amorphous silicon layers.

Figure 29A:
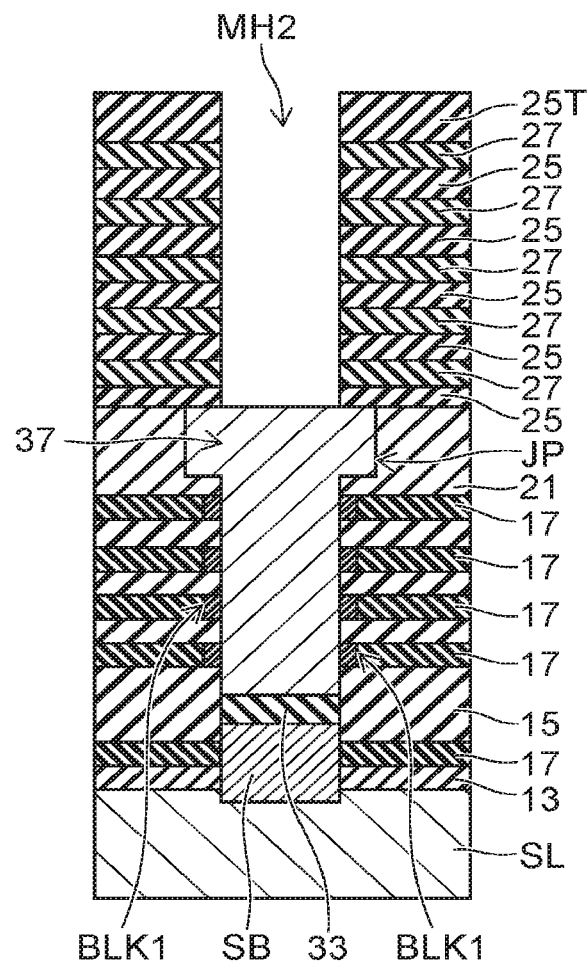

As shown in FIG. 29A, the memory hole MH2 is formed after alternately stacking the inter-layer insulating films 25 and the sacrificial films 27 on the inter-layer insulating film 21 and the sacrificial layer 37. The memory hole MH2 is formed to communicate with the sacrificial layer 37 from the upper surface of the inter-layer insulating film 25T of the uppermost layer.

Figure 29B:
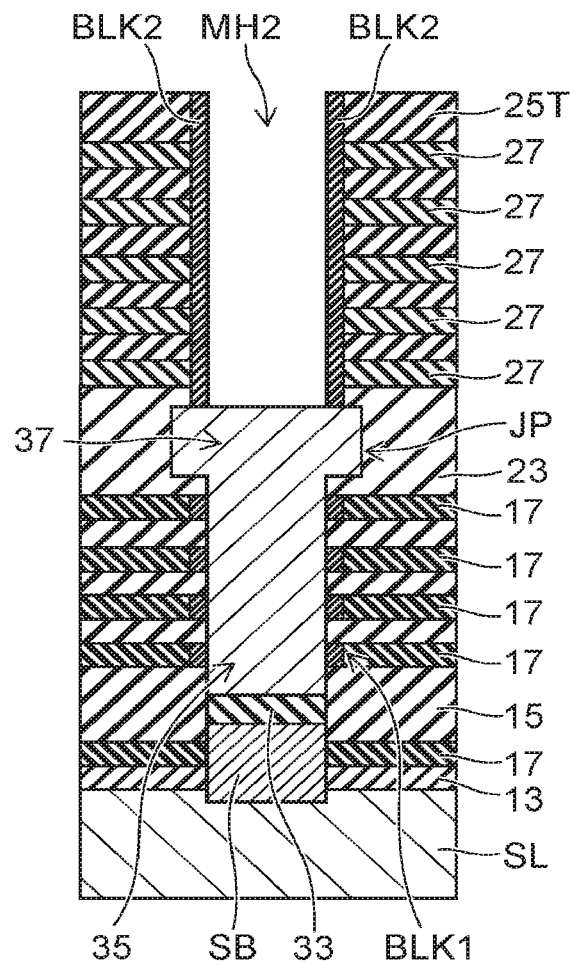

As shown in FIG. 29B, a blocking insulating film BLK2 is formed on the inner wall of the memory hole MH2. The blocking insulating film BLK2 is, for example, a silicon oxide film. The blocking insulating film BLK2 is formed by forming the blocking insulating film BLK2 to cover the inner surface of the memory hole MH2 and the upper surface of the inter-layer insulating film 25T and by subsequently selectively removing the portion deposited on the bottom surface of the memory hole MH2 and the portion deposited on the upper surface of the inter-layer insulating film 25T. For example, the blocking insulating film BLK2 is selectively removed using anisotropic RIE.

As shown in FIG. 30A, the sacrificial layer 35 that is filled into the memory hole MH1 and the sacrificial layer 37 that is filled into the connection portion JP are selectively removed. Thereby, the memory hole MH is formed in which the memory hole MH1, the connection portion JP, and the memory hole MH2 are formed as one body.

As shown in FIG. 30B, the charge trap film CT, the tunneling insulating film TN, and the semiconductor layer SF1 are formed in order on the inner surface of the memory hole MH. The charge trap film CT is, for example, a silicon nitride film; and the tunneling insulating film TN is, for example, a silicon oxide film. The semiconductor layer SF1 is, for example, an amorphous silicon layer.

Figure 31A:
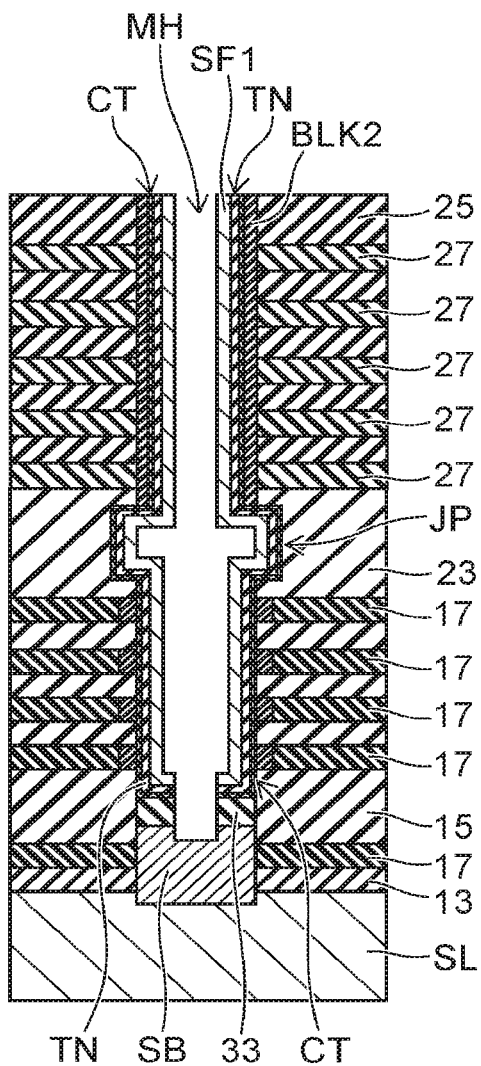

As shown in FIG. 31A, portions of the semiconductor layer SF1, the tunneling insulating film TN, the charge trap film CT, and the insulating film 33 at the bottom surface of the memory hole MH are selectively removed; and a portion of the semiconductor base SB is exposed.

Figure 31B:
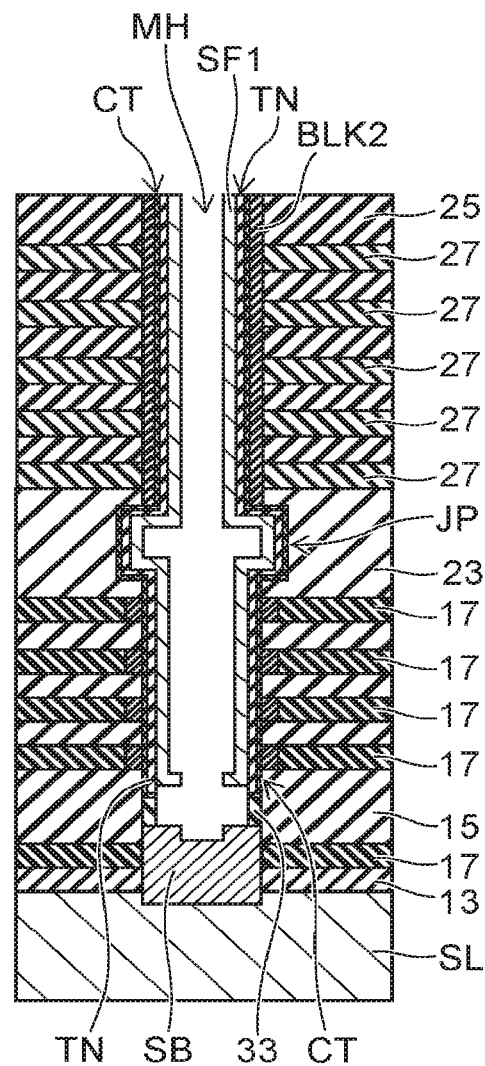

As shown in FIG. 31B, the lower ends of the tunneling insulating film TN and the charge trap film CT and a portion of the insulating film 33 are removed; and the lower end of the memory hole MH is enlarged in the horizontal direction.

As shown in FIG. 32A, the semiconductor layer SF2 that covers the inner surface of the memory hole MH is formed. The semiconductor layer SF2 is, for example, an amorphous silicon layer and contacts the semiconductor layer SF1. The semiconductor layer SF2 is formed to contact the semiconductor base SB at the lower end of the memory hole MH.

As shown in FIG. 32B, the insulating core CA is formed in the interior of the memory hole MH after forming the semiconductor layer SF in which the semiconductor layers SF1 and SF2 are formed as one body. Further, the word lines WL and the select gates SGS and SGD are formed by the manufacturing processes shown in FIGS. 12A to 14B.

In the embodiment, the blocking insulating films BLK1 and the blocking insulating film BLK2 are formed separately in the columnar portion PB1 and the columnar portion PB2. Thereby, the electrical characteristics of the memory film MF can be controlled independently between the columnar portions PB1 and PB2. For example, a coupling ratio difference that is caused by an outer diameter difference between the columnar portions PB1 and PB2 can be reduced.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

What is claimed is:

1. A memory device, comprising:
   a conductive layer;
   a plurality of first electrode layers stacked above the conductive layer;
   a first semiconductor layer extending through the plurality of first electrode layers in a first direction toward the plurality of first electrode layers from the conductive layer;
   a first insulating film between the first semiconductor layer and the plurality of first electrode layers, the first insulating film surrounding the first semiconductor layer, the first insulating film including a tunneling insulator film, a charge-trapping film and a blocking insulator film, the charge-trapping film being positioned between the tunneling insulator film and the blocking insulator film, the tunneling insulator film being positioned between the first semiconductor layer and the charge-trapping film, the blocking insulator film being positioned between charge-trapping film and the plurality of first electrode layers;
   a second electrode layer provided between the conductive layer and the plurality of first electrode layers; and
   a semiconductor base provided between the conductive layer and the first semiconductor layer, the semiconductor base extending through the second electrode layer in the first direction, the semiconductor base being connected to the first semiconductor layer,
   the charge-trapping film being spaced along the first direction from the semiconductor base, a distance in the first direction between the charge-trapping film and the semiconductor base being larger than a thickness of the blocking insulator film in a second direction toward the plurality of first electrode layers from the first semiconductor layer.

2. The device according to claim 1, wherein
   the plurality of first electrode layers includes a first electrode layer most proximal to the second electrode layer;
   the first semiconductor layer includes a first portion and a second portion, the first portion extending through the first electrode layer, the second portion being positioned at a level between the semiconductor base and the first insulating film; and
   the first semiconductor layer has a first thickness in the second direction at the first portion and a second thickness in the second direction at the second portion, the first thickness being thicker than the second thickness.

3. The device according to claim 1, wherein the semiconductor base includes silicon epitaxially grown on the conductive layer.

4. The device according to claim 1, wherein
   the semiconductor base includes a recessed portion at a side connected to the first semiconductor layer, and
   a contact area between the semiconductor layer and the semiconductor base is greater than an area of the recessed portion.

5. The device according to claim 1, further comprising a second insulating film between the first insulating film and the semiconductor base, the second insulating film contacting the semiconductor base.

6. The device according to claim 5, wherein the first insulating film has a first thickness in the second direction; and the second insulating film has a second thickness in the second direction, the second thickness being thinner than the first thickness.

7. The device according to claim 5, wherein
   the semiconductor base includes silicon provided on the conductive layer, and
   the second insulating film is a silicon oxide film.

8. The device according to claim 1, further comprising a plurality of third electrode layers stacked above the plurality of first electrode layers,
   the first semiconductor layer including a first portion, a second portion and a connecting portion, the first portion extending through the plurality of first electrode layers in the first direction, the second portion extending through the plurality of third electrode layers in the first direction, and a connection portion linking the first portion and the second portion.

9. The device according to claim 8, wherein
   the first semiconductor layer has a first width in the second direction at an outer perimeter of the first portion, a second width in the second direction at an outer perimeter of the second portion, and a third width in the second direction at an outer perimeter of the connection portion; and
   the third width is wider than the first width and the second width.

10. The device according to claim 8, further comprising a columnar insulating body extending in the first direction inside the first semiconductor layer.

11. The device according to claim 1, further comprising:
    a plurality of contact plugs connected to the plurality of first electrode layers, respectively, the plurality of contact plugs extending in the first direction; and
    a columnar body extending in the first direction through at least one of the plurality of first electrode layers, the columnar body being provided at a vicinity of one of the plurality of contact plugs,
    the columnar body including a second semiconductor layer, a third insulating film, and a fourth insulating film, the second semiconductor layer including a material same as a material of the plurality of first semiconductor layers, the third insulating film including a material same as a material of the first insulating film, the fourth insulating film being provided between the conductive layer and the second semiconductor layer, the fourth insulating film electrically isolating the second semiconductor layer from the conductive layer.

12. The device according to claim 11, wherein the fourth insulating film and a bottom of the second semiconductor layer are positioned inside the conductive layer.

13. The device according to claim 11, further comprising a fifth insulating film provided between the columnar body and the at least one of the plurality of first electrode layers, the fifth insulating film surrounding the columnar body.

14. A memory device, comprising:
a conductive layer;
a plurality of first electrode layers stacked in a first direction above the conductive layer;
a first semiconductor layer extending in the first direction;
a tunneling insulator film provided between the first semiconductor layer and the plurality of first electrode layers, the tunneling insulator film extending in the first direction;
a charge-trapping film provided between one of the plurality of first electrode layers and the tunneling insulator film;
a first silicon oxide film provided between the one of the plurality of first electrode layers and the charge-trapping film; and
a semiconductor base between the conductive layer and the first semiconductor layer, the semiconductor base protruding in the first direction from the conductive layer, the semiconductor base being connected to the first semiconductor layer,
the charge-trapping film being spaced along the first direction from the semiconductor base, a first distance in the first direction between the charge-trapping film and the semiconductor base being larger than a thickness of the first silicon oxide film in a second direction toward the plurality of first electrode layers from the first semiconductor layer.

15. The device according to claim 14, wherein the semiconductor base includes silicon epitaxially grown on the conductive layer.

16. The device according to claim 14, further comprising a second silicon oxide film provided between the semiconductor base and the charge-trapping film, the second silicon oxide film having a thickness in the first direction same as the first distance.

17. The device according to claim 14, further comprising a plurality of second electrode layers stacked above the plurality of first electrode layers,
the first semiconductor layer including a first portion, a second portion and a connecting portion, the first portion extending through the plurality of first electrode layers in the first direction, the second portion extending through the plurality of second electrode layers in the first direction, and a connection portion linking the first portion and the second portion.

18. The device according to claim 17, wherein
the first semiconductor layer has a first width in the second direction at an outer perimeter of the first portion, a second width in the second direction at an outer perimeter of the second portion, and a third width in the second direction at an outer perimeter of the connection portion; and
the third width is wider than the first width and the second width.

19. The device according to claim 18, further comprising a columnar insulating body extending in the first direction inside the first semiconductor layer.

* * * * *